US012587210B2

(12) United States Patent
Bal et al.

(10) Patent No.: US 12,587,210 B2
(45) Date of Patent: Mar. 24, 2026

(54) METHODS, SYSTEMS, AND APPARATUSES FOR REDUCING DC BIAS

(71) Applicant: STMicroelectronics International N.V., Geneva (CH)

(72) Inventors: Ankur Bal, Greater Noida (IN); Vikram Singh, Radaur (IN)

(73) Assignee: STMicroelectronics International N.V., Geneva (CH)

( * ) Notice: Subject to any disclaimer, the term of this patent is extended or adjusted under 35 U.S.C. 154(b) by 169 days.

(21) Appl. No.: 18/521,725

(22) Filed: Nov. 28, 2023

(65) Prior Publication Data

US 2024/0195432 A1     Jun. 13, 2024

Related U.S. Application Data

(60) Provisional application No. 63/386,687, filed on Dec. 9, 2022.

(51) Int. Cl.
   *H03M 3/00* (2006.01)
   *H03H 21/00* (2006.01)
(52) U.S. Cl.
   CPC ........ *H03M 3/458* (2013.01); *H03H 21/0012* (2013.01)

(58) Field of Classification Search
   CPC ............................ H03M 3/458; H03H 21/001
   USPC ........................................................ 341/143
   See application file for complete search history.

(56) References Cited

U.S. PATENT DOCUMENTS

| | | | |
|---|---|---|---|
| 6,570,863 B1 * | 5/2003 | Kim ..................... | H04B 1/7097 |
| | | | 370/335 |
| 2013/0156635 A1 * | 6/2013 | Lee ........................... | C22C 1/03 |
| | | | 420/531 |

OTHER PUBLICATIONS

Yates et al., "DC Blocker Algorithms," IEEE Signal Processing Magazine, 132-134, (Mar. 2008).

* cited by examiner

*Primary Examiner* — Jean B Jeanglaude
(74) *Attorney, Agent, or Firm* — Alston & Bird LLP

(57)     ABSTRACT

Various examples in accordance with the present disclosure provide example methods, systems, and apparatuses that may reduce direct current (DC) bias in biased signal inputs. For example, an example system includes a signal operator and an adaptive filter. The signal operator receives a biased signal input. The adaptive filter provides an estimated bias parameter to the signal operator. The signal operator generates an unbiased signal output based at least in part on the biased signal input and the estimated bias parameter.

18 Claims, 11 Drawing Sheets

| Fundamental freq(Hz) | 16240621.0938 |
|---|---|
| Dom Harmonic freq(Hz) | 13183515.9912 |
| Dom Harmonic ampl(dB) | -63.0857 |
| SNDR(dB) | 46.4024 |
| SNR(dB) | 46.4197 |
| THD(dB) | -70.3922 |

| Fundamental freq(Hz) | 16240621.0938 |
|---|---|
| Dom Harmonic freq(Hz) | 25863508.7891 |
| Dom Harmonic ampl(dB) | -75.5863 |
| SNDR(dB) | 47.4754 |
| SNR(dB) | 47.4787 |
| THD(dB) | -78.621 |

| Fundamental freq(Hz) | 16240621.0938 |
| Dom Harmonic freq(Hz) | 25863508.7891 |
| Dom Harmonic amp(dB) | -75.5863 |
| SNDR(dB) | 47.4352 |
| SNR(dB) | 47.4381 |
| THD(dB) | -78.621 |

1400

| Fundamental freq(Hz) | 16240621.0938 |
| Dom Harmonic freq(Hz) | 25863508.7891 |
| Dom Harmonic amp(dB) | -75.5863 |
| SNDR(dB) | 47.4754 |
| SNR(dB) | 47.4787 |
| THD(dB) | -78.621 |

1300

METHODS, SYSTEMS, AND APPARATUSES FOR REDUCING DC BIAS

CROSS-REFERENCE TO RELATED APPLICATIONS

This application claims priority to and the benefit of U.S. Provisional Patent Application No. 63/386,687, filed Dec. 9, 2022, the entire content of which is incorporated by references in its entirety.

FIELD OF THE INVENTION

Example embodiments of the present disclosure relate generally to signal processing and, more particularly, to methods, systems and apparatuses that reduce or remove biases (such as, but not limited to, direct current (DC) biases) from signals.

BACKGROUND

Applicant has identified many technical challenges and difficulties associated with processing and/or converting signals.

BRIEF SUMMARY

Various embodiments described herein related to methods, apparatuses, and systems for reducing biases.

In accordance with various embodiments of the present disclosure, an example system is provided. In some embodiments, the example system comprises a signal operator and an adaptive filter.

In some embodiments, the signal operator receives a biased signal input. In some embodiments, the adaptive filter provides an estimated bias parameter to the signal operator. In some embodiments, the estimated bias parameter indicates an estimated bias component associated with the biased signal input.

In some embodiments, the signal operator comprises an adder.

In some embodiments, the signal operator generates an unbiased signal output based at least in part on the biased signal input and the estimated bias parameter.

In some embodiments, when generating the unbiased signal output, the signal operator removes the estimated bias component from the biased signal input.

In some embodiments, the signal operator receives the biased signal input via a signal input data path and provides the unbiased signal output via a signal output data path. In some embodiments, the adaptive filter is not on the signal input data path and is not on the signal output data path.

In some embodiments, the adaptive filter implements a Least Mean Square (LMS) algorithm.

In some embodiments, the adaptive filter comprises an adder and a delayer.

In some embodiments, the adaptive filter receives an initial amplitude input.

In some embodiments, the initial amplitude input is correlated to the biased signal input.

In accordance with various embodiments of the present disclosure, an example method is provided.

In some embodiments, the example method comprises: receiving a biased signal input; generating an estimated bias parameter indicating an estimated DC bias associated with the biased signal input; and generating an unbiased signal output based at least in part on the biased signal input and the estimated bias parameter.

In some embodiments, the example method further comprises receiving an initial amplitude input.

In some embodiments, the initial amplitude input is correlated to the biased signal input.

In some embodiments, the example method further comprises: generating a first estimated bias parameter associated with the biased signal input based at least in part on the initial amplitude input; and generating a first error signal output based at least in part on the first estimated bias parameter and the biased signal input.

In some embodiments, the example method further comprises: generating a second estimated bias parameter based at least in part on adding the first estimated bias parameter to a first multiplication of the first error signal output and an adaptive adjustment parameter; and generating a second error signal output based at least in part on the second estimated bias parameter and the biased signal input.

In accordance with some embodiments of the present disclosure, an example computer program product is provided. In some embodiments, the computer program product comprises at least one non-transitory computer-readable storage medium having computer-readable program code portions stored therein. In some embodiments, the computer-readable program code portions comprise an executable portion configured to receive a biased signal input; generate an estimated bias parameter indicating an estimated DC bias associated with the biased signal input; and generate an unbiased signal output based at least in part on the biased signal input and the estimated bias parameter.

In accordance with some embodiments of the present disclosure, an example analog-to-digital converter (ADC) is provided. In some embodiments, the example ADC comprises a sigma-delta modulation system and a DC bias reduction system.

In some embodiments, the sigma-delta modulation system generates a biased signal.

In some embodiments, the DC bias reduction system comprises a signal operator and an adaptive filter.

In some embodiments, the adaptive filter provides an estimated bias parameter to the signal operator.

In some embodiments, the signal operator receives the biased signal.

In some embodiments, the signal operator comprises an adder.

In some embodiments, the signal operator generates an unbiased signal based at least in part on the biased signal and the estimated bias parameter.

In some embodiments, when generating the unbiased signal, the signal operator removes an estimated bias component from the biased signal based on the estimated bias parameter.

In some embodiments, the signal operator receives the biased signal via a signal input data path and provides the unbiased signal via a signal output data path. In some embodiments, the adaptive filter is not on the signal input data path and is not on the signal output data path. In some embodiments, the adaptive filter implements a LMS algorithm.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which.

DETAILED DESCRIPTION OF THE INVENTION

Figure 1:
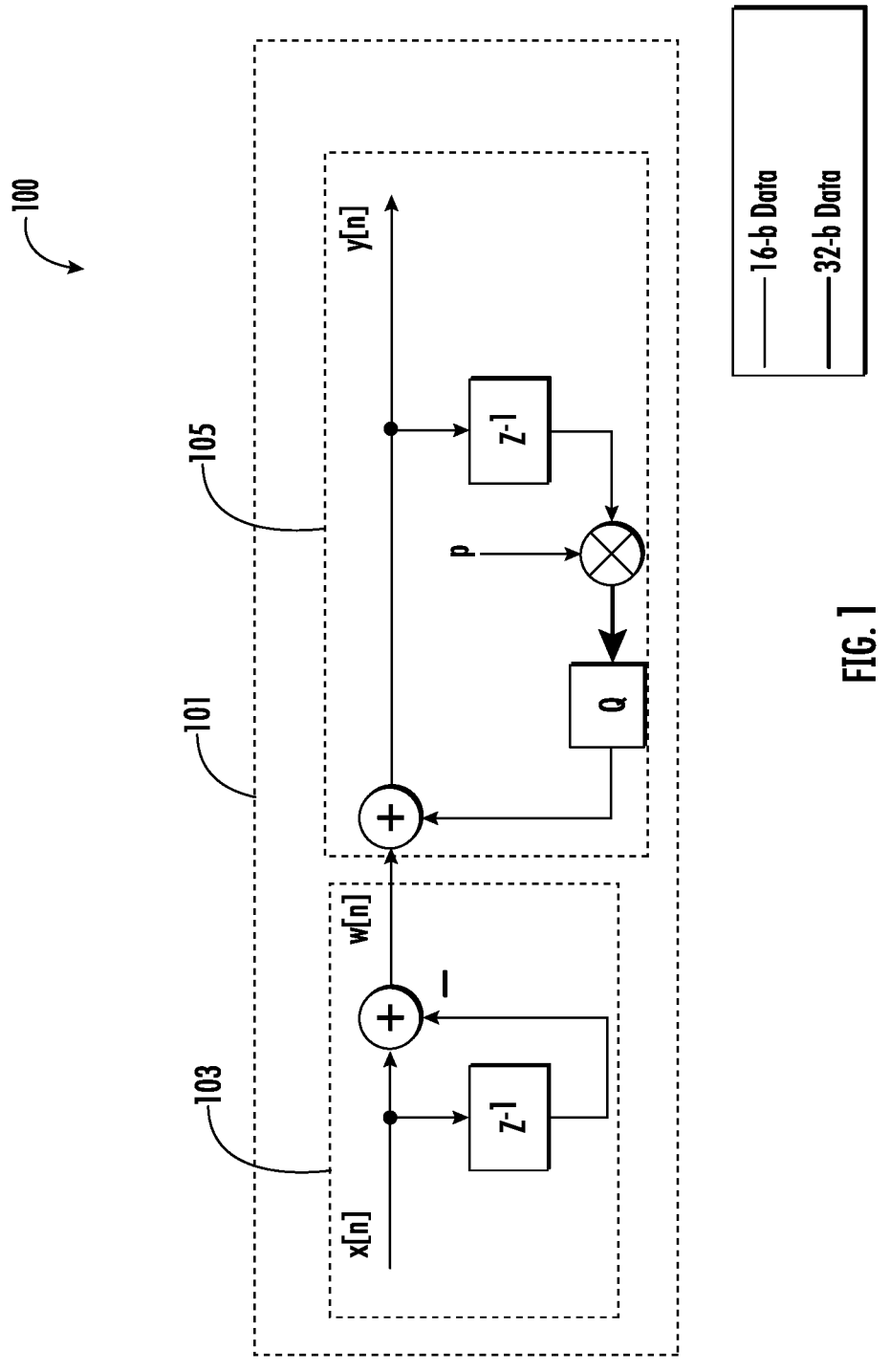
FIG. 1 provides an example signal processing diagram illustrating an example signal processing system.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

As described above, there are many technical challenges and difficulties associated with signal processing and signal conversion. As an example, many methods and systems that perform digital signal processing (DSP) (such as, but not limited to, analog-to-digital converters (ADCs)) are plagued by technical challenges and difficulties, including, but not limited to, those associated with direct current (DC) biases.

For example, an example ADC (such as, but not limited to, a sigma-delta ADC) may receive one or more signal inputs such as, but not limited to, one or more analog signals. In some examples, an analog signal may be in the form of a continuous time signal that represents a plurality of continuous values over a time period. Examples of analog signals may be represented as, for example but not limited to, electric voltages, electric currents, electric charges, and/ or the like.

In some examples, an example ADC may convert or "digitize" one or more analog signals into one or more digital signals. In such an example, an example digital signal may be in the form of a discrete time signal that represents a plurality of quantized values in a plurality of time points. For example, a digital signal may comprise samples that comprise values from a discrete value set.

In some examples, an example analog-to-digital conversion process by an example ADC may include example steps such as, but not limited to, sampling and quantization. In some examples, during sampling, the example analog-to-digital conversion process reduces the analog signal (which is a continuous-time signal) to a discrete-time signal. For example, the example analog-to-digital conversion process samples the analog signal at a plurality of time points and generates time samples. In some examples, during quantization, the example analog-to-digital conversion process replaces each sample value in the discrete-time signal with one of the values from a given discrete set through, for example but not limited to, approximation by truncating and/or rounding. For example, the example analog-to-digital conversion process digitizes the time samples by mapping each amplitude of the time samples to one of the values from the given discrete set.

In the present disclosure, the terms "DC bias," "direct current bias," "DC component," "DC bias component," "DC offset" refer to a mean amplitude (or an average amplitude) of a signal (for example, but not limited to, an example signal output from an ADC). In some embodiments, the DC bias component represents a constant offset in the example amplitude of the example signal. For example, if the mean amplitude of the example signal is not zero, the example signal comprises a DC bias component. If the mean amplitude of the example signal is zero, the example signal does not comprise a DC bias component.

Many ADCs produce outputs that comprise DC bias components. In such examples, the mean amplitude (also referred to as the average amplitude) of the digitized time samples from these ADCs are not zero. There are many factors that may cause DC bias components in the outputs from the ADCs. For example, analog signals that are provided as inputs to ADCs may comprise DC bias components. As another example, environmental factors (such as, but not limited to, temperature) and/or structural limitations within the ADCs may result in DC bias components in the signal outputs. As another example, approximation by truncating may produce DC bias components because truncation reduces the bit rate of the example signal.

DC bias components may cause many technical problems and issues. As an example, many signal processing implementations require combining or switching between different signals. If some of these signals comprise DC bias components while others do not comprise DC bias components, or if these signals comprise different DC bias components, combining or switching these signals may produce undesirable or unreliable results. For example, example ADCs may digitize temperature signals into digital signals. If some of the digital signals comprise DC bias components while others do not comprise DC bias components, or if these digital signals comprise different DC bias components, combining these digital signals do not produce accurate representations of the temperature signals.

In some examples, an example filter may be implemented in the signal chain of an example ADC (such as, but not limited to, a sigma-delta ADC) to remove any unwanted parasitic DC bias in the output signal. For example, the signal chain of an example sigma-delta ADC may comprise a data path that comprises a high pass filter as an example DC filter. In such an example, the high pass filter may filter out the DC bias component of the signal by passing signals with frequencies that are higher than a cutoff frequency as set by the high pass filter while attenuating signals with frequencies that are lower than the cutoff frequency. By definition, the DC bias component has a frequency of zero (0) because it is a constant amplitude component in the signal. As such, the high pass filter may remove the DC bias component when an appropriate cutoff frequency is set.

However, implementing a high pass filter in an ADC (such has, but not limited to, an example sigma-delta ADC) may cause many technical disadvantages.

For example, because the high pass filter lies in the data path of an example sigma-delta ADC, the high pass filter may redistribute spectrum energy in the data path such that the power of the DC bias component is redistributed into frequency band(s) of interest, raising the noise floor of the signal output and degrading in-band performance. In particular, the energy of the DC bias component is still a part of the signal spectra of the output signal, but the signal power at the power spectrum bin corresponding to the DC bias component is highly attenuated. As such, the high pass filter can cause impairments and negative impacts on output signals including, but are not limited to, adding considerable group delay at low frequencies and causing the filtered signal to manifest an increased noise level of non-DC frequencies (in other words, increased signal-to-noise ratio (SNR) degradation).

As another example, the high pass filter must be present in the example ADC and switched on when there is a signal input, causing continuous dissipation of power from the ADC. As such, the high pass filter requires a high level of power consumption in order to remove the DC bias component from a signal input.

Various embodiments of the present disclosure overcome the above technical challenges and difficulties, and provide various technical improvements and advantages. For example, various embodiments of the present disclosure provide an example system for reducing DC bias. In some embodiments, the example system comprises a circuit that functions as a DC removal filter for estimating and removing the DC bias component in real time.

For example, an example system for reducing DC bias in accordance with some embodiments of the present disclosure comprises a signal operator and an adaptive filter.

In some embodiments, the adaptive filter may implement one or more adaptive filtering algorithms. For example, the adaptive filter may comprise a Least Mean Square (LMS) filter (including, but not limited to, a signal tap LMS filter) that implements a LMS filtering algorithm to perform a DC estimation operation to estimate the DC bias component in the biased signal input (for example, the amplitude offset associated with the DC bias component). In some embodiments, the adaptive filter provides an estimated bias parameter that indicates the estimated DC bias to the signal operator.

In some embodiments, the signal operator may comprise an adder (also referred to as a "summing unit" or a "summation block"). In some embodiments, the adder may be in the form of a two-point adder that receives two inputs and generates one output. For example, the signal operator may receive the biased signal input in the functional data path as one input, and receive the estimated bias parameter from the adaptive filter as another input. In this example, the signal operator may subtract the estimated DC bias indicated by the estimated bias parameter from the biased input signal to generate an unbiased signal output.

As illustrated in this example, the adaptive filter may function as a DC removal filter by estimating the amount of the DC bias component. However, in some examples, the adaptive filter does not perform the type of filtering operation as that of a high pass filter, as the signal operator of the adaptive filter subtracts the DC bias from the biased signal input (instead of filtering the biased signal input). As such, example methods, systems, and apparatuses in accordance with some embodiments of the present disclosure can reduce or eliminate DC bias components from biased signal inputs without interfering with functional data paths (for example, the functional data path of an ADC) and without introducing additional noises in the signal bands.

As such, various embodiments of the present disclosure provide various technical benefits and advantages. For example, some embodiments of the present disclosure remove the high pass filter from the signal chain, thereby preventing energy redistribution and loss in signal SNR while reducing or removing the DC bias component from biased signal inputs. Additionally, or alternatively, some embodiments of the present disclosure provide an example adaptive filter that dynamically generates and/or adjusts coefficients (in contrast with high pass filters or other digital filters that require fixed coefficients) and can operate in the background to decorrelate the DC bias component in the signal without sitting on the functional data path. Additionally, or alternatively, the example adaptive filter in some embodiments of the present disclosure can provide a perfectly linear phase filter that reduces or eliminates group delay issues that are plagued by many high pass filters. Additionally, or alternatively, the example adaptive filter in some embodiments of the present disclosure can be switched off once the DC bias is estimated (in contrast with high pass filters that are required to remain being turned on), dynamically saving power and reducing energy requirements for operating an example ADC.

Referring now to FIG. 1 to FIG. 5, example diagrams associated with an example signal processing system are provided. In particular, FIG. 1 illustrates some example components of an example signal processing system 100. FIG. 2, FIG. 3, FIG. 4 and FIG. 5 illustrate example diagrams associated with example signal inputs and/or example signal outputs of the example signal processing system 100 shown in FIG. 1.

Referring now to FIG. 1, the example signal processing system 100 comprises an example fixed-point DC blocker 101. In the example shown in FIG. 1, the example fixed-point DC blocker 101 comprises a differentiator 103 followed by a leaky integrator 105.

In some examples, the differentiator 103 is in the form of a digital differentiator, and the transfer function of the differentiator 103 can be represented in the following equation:

$$R(z)=1-z^{-1}$$

As shown in the above example, by having a z-plane zero at z=1, the differentiator 103 has the infinite attenuation at 0 Hz. As such, the differentiator 103 may remove the DC bias component from the biased signal input x[n]. However, the differentiator 103 also attenuates spectral components close to the DC bias component, as shown by the dashed curve 202 in the example response diagram 200 shown in FIG. 2.

Referring back to FIG. 1, the example fixed-point DC blocker 101 may shore up the drooping frequency response of the differentiator 103 by placing a pole just inside the z-plane zero at z=1 using a single-pole filter. In such an example, the transfer function of the single-pole filter can be represented in the following equation:

$$S(z)=1/(1-pz^{-1})$$

In the above example, the p parameter is a real pole, and the value of the p parameter is between 0 and 1 (0<p<1). The above transfer function illustrates the leaky integrator 105 of the example fixed-point DC blocker 101 shown in FIG. 1. In particular, the leaky integrator 105 comprises a nonideal integrator that leaks some energy away. As such, the response from the leaky integrator 105 is not an ever-increasing output, but rather an output that increases for a time and then levels off.

In the example shown in FIG. 1, the signal output from the differentiator 103 is provided as a signal input to the leaky integrator 105. In some examples, the transfer function of the cascaded combination of the differentiator 103 and the leaky integrator 105 can be represented in the following equation:

$$H(z)=R(z)S(z)=(1-z^{-1})/(1-pz^{-1})$$

Figure 2:
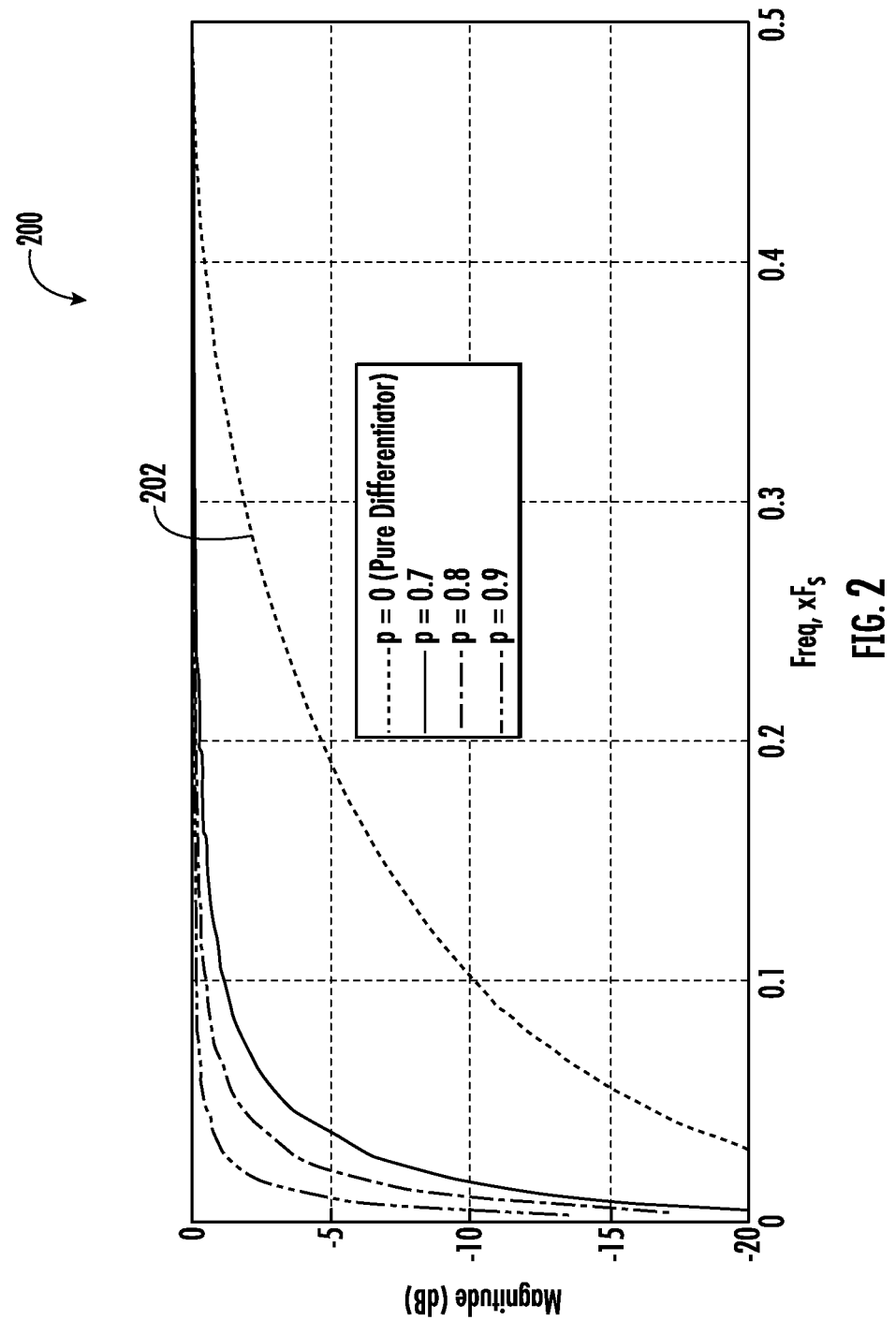
FIG. 2 provides an example response diagram illustrating example correlations between example magnitudes and example frequencies associated with example signal outputs from the example signal processing system shown in FIG. 1.

Referring now to FIG. 2, the example response diagram 200 illustrates example correlations between example magnitudes and example frequencies associated with example signal outputs from the example signal processing system 100 shown in FIG. 1.

In particular, the example response diagram 200 illustrates different magnitudes (correlated to frequencies) of responses H(z) that are caused by different values of the p parameter. As shown in the example response diagram 200, the higher the value of the p parameter, the more the DC bias component is reduced from the output by the example fixed-point DC blocker 101, as evident by magnitudes of responses H(z).

In addition, the value of the p parameter may affect the quality factor (also referred to as the "Q" factor) of the example fixed-point DC blocker 101. In some examples, the Q factor indicates the "sharpness" of signal outputs from the example fixed-point DC blocker 101.

Figure 3:
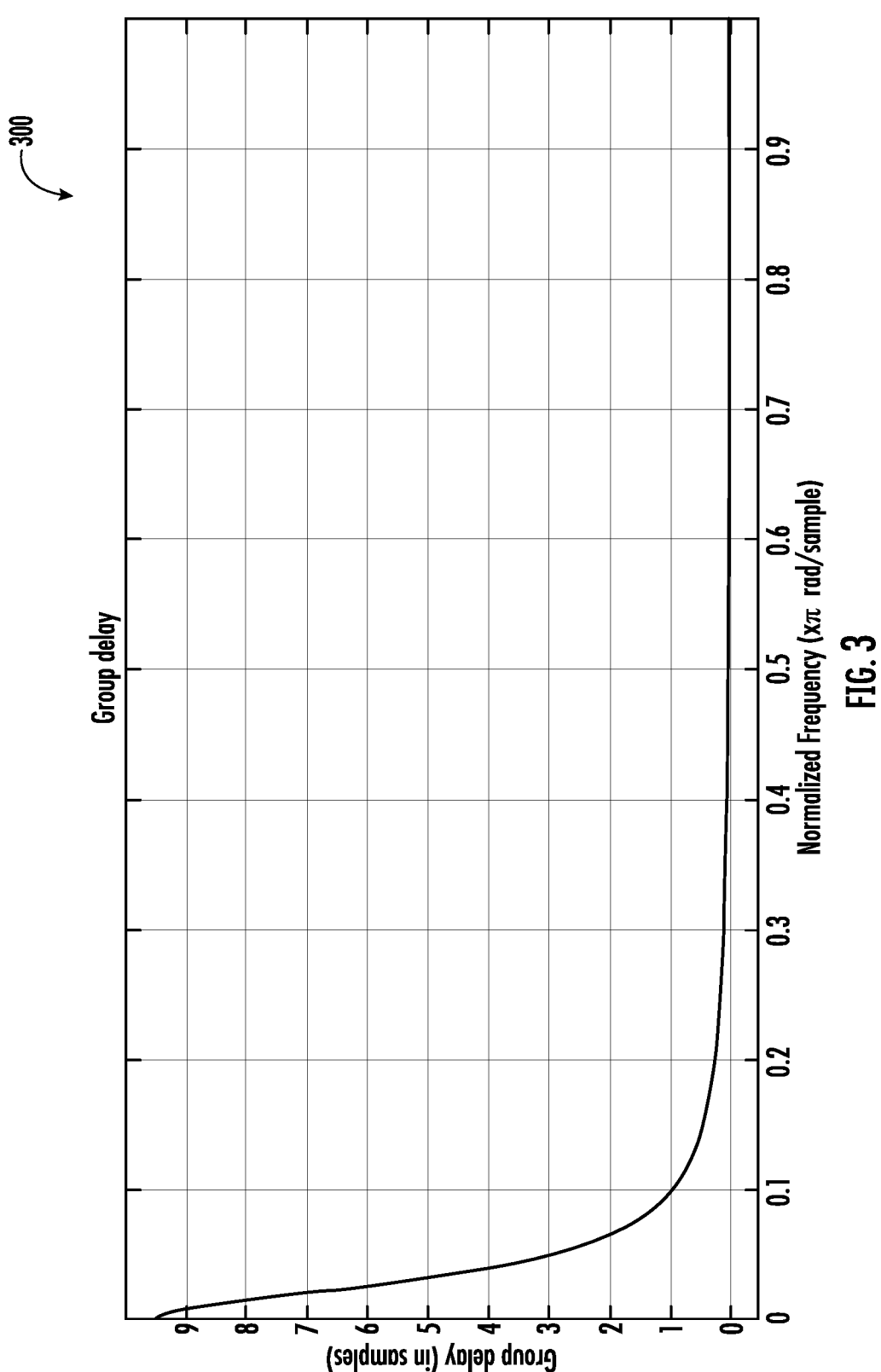
FIG. 3 provides an example response diagram illustrating example correlations between example group delays and example frequencies associated with the example signal processing system shown in FIG. 1.
Figures 4, 5:
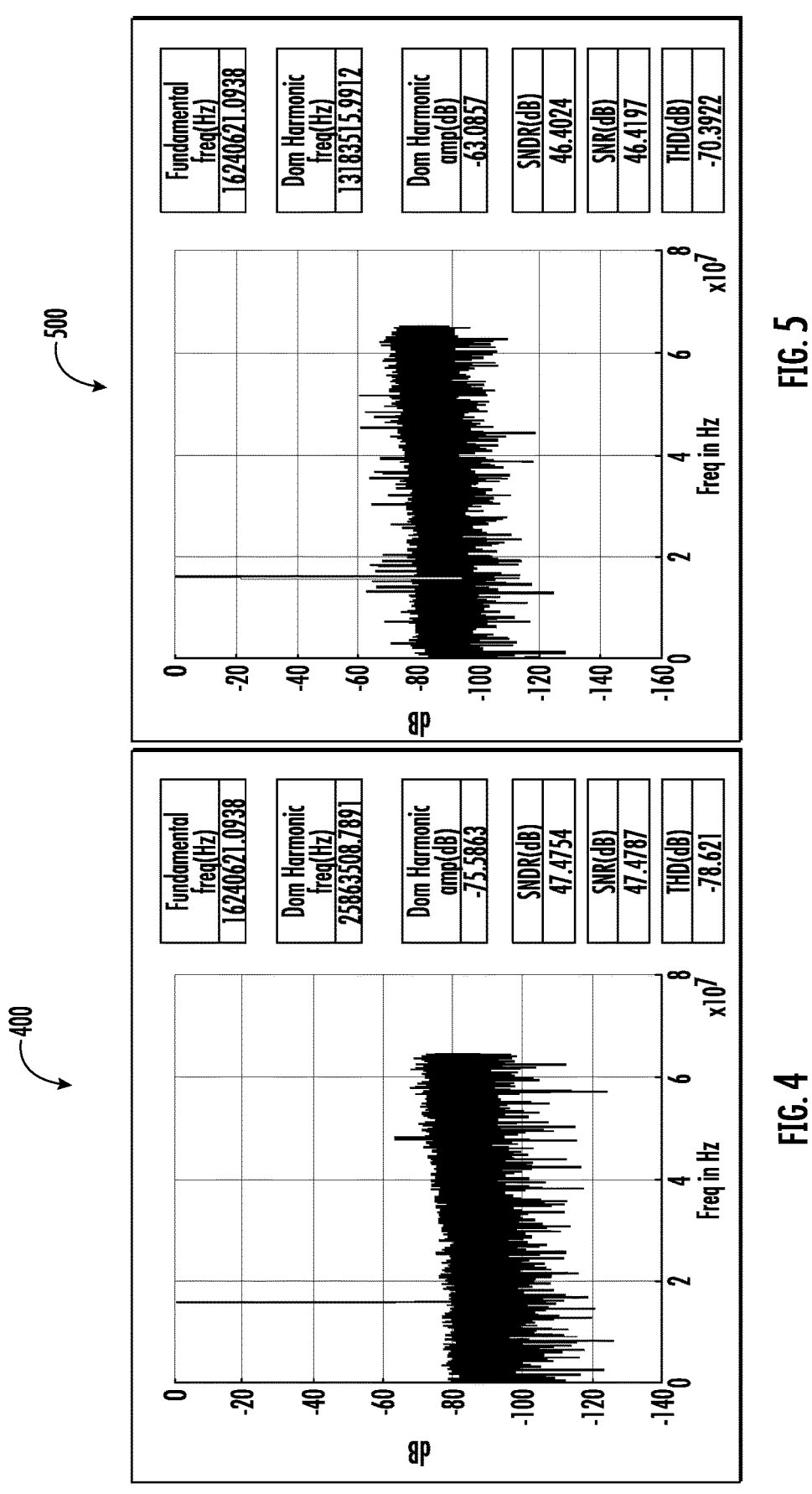
FIG. 4 provides an example response diagram illustrating example magnitudes and example frequencies associated with an example biased signal input prior to being processed by the example signal processing system shown in FIG. 1.
FIG. 5 provides an example response diagram illustrating example magnitudes and example frequencies associated with an example signal output generated by the example signal processing system shown in FIG. 1 based at least in part on processing the example biased signal input shown in FIG. 4.

While the example fixed-point DC blocker 101 shown in FIG. 1 may reduce or remove the DC bias component from a signal input (as evident by the response diagram 200 shown in FIG. 2), the example fixed-point DC blocker 101 is plagued by many technical challenges and difficulties, as evident by the example diagrams shown in FIG. 3 to FIG. 5.

Referring now to FIG. 3, an example response diagram 300 illustrates example correlations between example group delays and example frequencies associated with the example signal processing system shown in FIG. 1.

In the present disclosure, the term "group delay" refers to a measurement of the time that is taken by a signal to get through a signal processing system. In the example shown in FIG. 3, the group delay for the signal in the lower frequency band is high. This may be due to the example fixed-point DC blocker 101 functioning as a high pass filter that reduces or removes signals in the lower frequency band. Because the example fixed-point DC blocker 101 is less responsive in the lower frequency band, the example fixed-point DC blocker 101 generates responses that are less linear. As such, the group delays can negatively impact the performance of the example fixed-point DC blocker 101.

Referring now to FIG. 4 and FIG. 5, example response diagrams along with corresponding signal measurement parameters are illustrated. In particular, FIG. 4 provides an example response diagram 400 illustrating example magnitudes and example frequencies associated with an example biased signal input prior to being processed by the example signal processing system 100 shown in FIG. 1. FIG. 5 provides an example response diagram 500 illustrating example magnitudes and example frequencies associated with an example signal output from the example signal processing system 100 shown in FIG. 1 after the example signal processing system 100 processes the example biased signal input associated with FIG. 4.

In the example shown in FIG. 4, the signal to noise ratio (SNR) of the example biased signal input is 47.4787. As described above, the example signal processing system 100 shown in FIG. 1 may process the example biased signal input to remove the DC bias component. In the example shown in FIG. 5, the SNR of the example signal output from the example signal processing system 100 is 46.4197. As such, the example signal processing system 100 may cause a reduction or degradation of the SNR. In other words, the example signal processing system 100 may add noise to the biased signal input when removing the DC bias component from the biased signal input.

In some examples, the addition of noise in the signal output is caused by the example fixed-point DC blocker 101. In the example shown in FIG. 1, the example fixed-point DC blocker 101 may lie in the data path of the signal chain and may function as a low area overhead filter. As such, the example fixed-point DC blocker 101 may redistribute spectrum energy in the data path such that the power of the DC bias component is redistributed into frequency band(s) of interest, causing the reduction of the SNR by manifesting an increased noise level of non-DC frequencies.

The degradation of the SNR caused by the example fixed-point DC blocker 101 may impose various technical challenges and difficulties. For example, the increased noise level may cause the example fixed-point DC blocker 101 to provide a less accurate filtering of DC bias component(s) from the biased signal input. As another example, the lower SNR may cause the example fixed-point DC blocker 101 to generate signals that border on unreadable.

Figure 6:
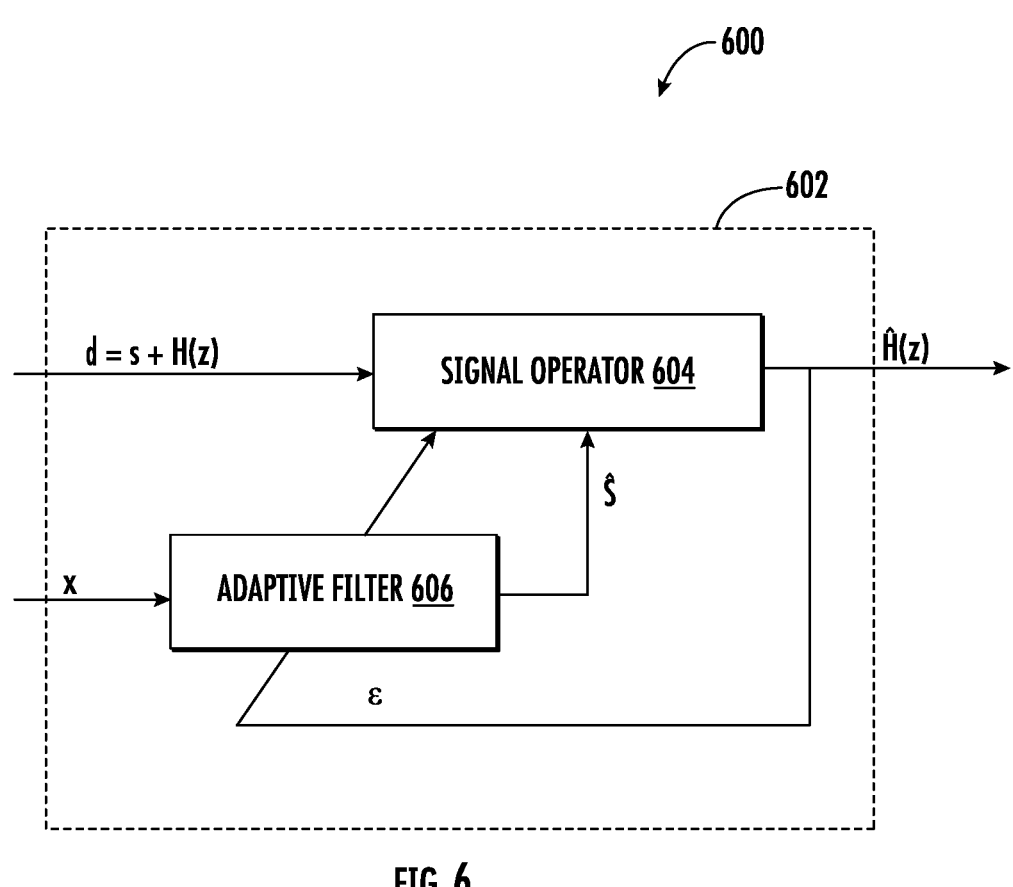
FIG. 6 provides an example signal processing diagram illustrating an example DC bias reduction system in accordance with some embodiments of the present disclosure.

As described above, various embodiments of the present disclosure overcome these technical challenges and difficulties, and provide various technical advantages and improvements. Referring now to FIG. 6, an example signal processing diagram 600 illustrating an example DC bias reduction system 602 in accordance with some embodiments of the present disclosure is provided.

As described above, various embodiments of the present disclosure utilizes one or more adaptive filters. In the example shown in FIG. 6, the example DC bias reduction system 602 comprises an adaptive filter 606.

In the present disclosure, the terms "adaptive filter" and "adaptive filter module" refer to a device that is in the form of physical hardware and/or software embedded in hardware that estimates, predicts, and/or forecasts DC bias component in one or more signal inputs.

In some embodiments, an example adaptive filter may be in the form of one or more digital filters. In such examples, the example adaptive filter may comprise one or more processing components that are coupled to one or more peripheral components such as, but not limited to, one or more memory components. In some embodiments, the one or more processing components may comprise one or more of complex programmable logic devices (CPLDs), microprocessors, multi-core processors, co-processing entities, application-specific instruction-set processors (ASIPs), application specific integrated circuits (ASICs), field programmable gate arrays (FPGAs), programmable logic arrays (PLAs), controllers, and/or the like. In some embodiments, the one or more memory components may comprise one or more volatile memories and/or one or more non-volatile memories. Examples of volatile memories may include, but are not limited to, random-access memory (RAM), dynamic random access memory (DRAM), static random access memory (SRAM), fast page mode dynamic random access memory (FPM DRAM), extended data out DRAM (EDO DRAM), synchronous DRAM (SDRAM), double data rate SDRAM (DDR SDRAM), double data rate 2 SDRAM (DDR2 SDRAM), double data rate 3 SDRAM (DDR3 SDRAM), Rambus DRAM (RDRAM), Rambus inline memory module (RIMM), dual in-line memory module (DIMM), single in-line memory module (SIMM), video random access memory (VRAM), cache memory, register memory, and/or the like. Examples of non-volatile memories may include, but are not limited to, read-only memory (ROM), programmable ROM (PROM), erasable programmable ROM (EPROM), electrically erasable programmable ROM (EEPROM), flash memory, SD memory cards, memory sticks, conductive-bridging RAM (CBRAM), parameter RAM (PRAM), ferroelectric RAM (FeRAM), resistive RAM (RRAM), SONOS, racetrack memory, and/or the like.

In some embodiments, the example adaptive filter may implement one or more adaptive filtering algorithms. For example, the example adaptive filter may comprise programming instructions stored in the one or more memory components, and the programming instructions may comprise one or more adaptive filtering algorithms (such as, but not limited to, a LMS filtering algorithm). In some embodiments, the one or more processing components of the example adaptive filter may execute the programming instructions, such that the one or more processing components of the example adaptive filter may perform operations provided in the one or more adaptive filtering algorithms.

While the description above provides an example structure of an example adaptive filter as an example digital filter, it is noted that the scope of the present disclosure is not limited to the description above. In some examples, the example adaptive filter in accordance with some embodiments of the present disclosure may be in the form of an analog filter. In such examples, the example adaptive filter may comprise one or more electric circuits (such as, but not limited to, sample-and-hold circuits, transducer circuits, metal-oxide-semiconductor field-effect transistor (MOSFET) circuits, and/or the like) that implement one or more adaptive filtering algorithms.

Referring back to FIG. 6, in some embodiments, the example adaptive filter 606 may be defined by one or more filter coefficients (also referred to as "filter weights"). In the present disclosure, a filter coefficient (or filter weight) refers to a coefficient of the difference equation associated with the example adaptive filter 606. In some embodiments, the example adaptive filter 606 may be in the form of an example finite impulse response (FIR) filter. In such an example, the filter coefficients are the values of the impulse responses from the example adaptive filter 606 (such as, but not limited to, the values of the estimated bias parameters).

While the description above provides an example of example adaptive filter 606 as an FIR filter, it is noted that the scope of the present disclosure is not limited to the description above. In some examples, an example adaptive filter 606 may be in one or more additional and/or alternative forms such as, but not limited to, infinite impulse response (IIR) filters.

In some embodiments, the example adaptive filter 606 may implement one or more adaptive filtering algorithms so that the example adaptive filter 606 may self-adjust the one or more filter coefficients. For example, the one or more memory components of the example adaptive filter 606 may store programming instructions that represent one or more adaptive filtering algorithms, and the one or more processing components of the example adaptive filter 606 may execute the adaptive filtering algorithms to adjust the one or more filter coefficients.

In the present disclosure, the term "adaptive filtering algorithm" refers to an algorithm that, when implemented by an example adaptive filter, can adjust the behavior of the example adaptive filter (such as, but not limited to, filter coefficients). Examples of adaptive filtering algorithms include, but not limited to, least mean square (LMS) algorithms.

As an example, an example LMS algorithm may update one or more filter coefficients associated with the example adaptive filter to coverage to the optimum filter coefficients based on the gradient descent mechanism. In this example, the example LMS algorithm may update the one or more filter coefficients based at least in part on an error signal, which indicates a difference between the actual signal and the desired signal. For example, the example LMS algorithm may start with assuming an initial filter coefficient for the example adaptive filter, and the example adaptive filter may produce a signal output based on the initial filter coefficient. In this example, an error signal is generated based on the signal output from the example adaptive filter, and the example LMS algorithm may adjust the one or more filter coefficients of the example adaptive filter to reduce the mean square value of the error signal. Because the error signal indicates the difference between the actual signal and the desired signal, the example adaptive filter operates at an optimum state when the mean square value of the error signal stabilizes at the least value.

In some embodiments, an example adaptive filter that implements a LMS algorithm is also referred to as a LMS filter. Additional details associated with LMS algorithms and LMS filters are described herein.

Referring back to FIG. 6, in some embodiments, the example DC bias reduction system 602 comprising a signal operator 604.

In the present disclosure, the term "signal operator" refers to a device that is in the form of physical hardware and/or software embedded in hardware that may perform one or more operations on one or more inputs, including, but not limited to, addition, substation, multiplication, division, and/or the like.

In some embodiments, the signal operator 604 receives a biased signal input. In the present disclosure, the term "biased signal input" refers to a signal (such as, but not limited to, an analog signal, a digital signal, and/or the like) that comprises a DC bias component. In some embodiments, the biased signal input is non-transitory.

In the example shown in FIG. 6, the biased signal input d may be represented in the following equation:

$$d=s+H(z)$$

In the above example, s represents the DC bias component, and H(z) represents a desired signal input that does not comprise the DC bias component.

In some embodiments, the signal operator 604 comprises an adder. In the present disclosure, the term "adder" refers to a device that is in the form of physical hardware and/or software embedded in hardware that generates a signal output based at least in part on performing addition operations and/or subtraction operations on two or more inputs.

In the example shown in FIG. 6, the signal operator 604 receives two inputs: the biased signal input d and an estimated bias parameter s. In some embodiments, the signal operator 604 generates a signal output (z) based at least in part on the biased signal input d and the estimated bias parameter s. For example, when generating the signal output H(z), the signal operator 604 removes the estimated bias component from the biased signal input d based on the estimated bias parameter s, as reflected in the following equation:

$$\hat{H}(z)=d-\hat{s}=s+H(z)-\hat{s}=H(z)+(s-\hat{s})$$

As illustrated in the example equation above, when the estimated bias component indicated by the estimated bias parameter $\hat{s}$ approximates or equals the DC bias component s, the signal output H(z) is an unbiased signal output because the estimated bias parameter $\hat{s}$ cancels out the DC bias component s. In some embodiments, the unbiased signal output $\hat{H}(z)$ does not comprise a DC bias component. In such examples, the mean amplitude of the unbiased signal output $\hat{H}(z)$ equals zero.

In some embodiments, the example adaptive filter 606 generates the estimated bias parameter $\hat{s}$ based at least in part on the error signal output E. In some embodiments, the error signal output ε is an output from the signal operator 604. In some embodiments, the error signal output ε is non-transitory.

In some embodiments, the signal output $\hat{H}(z)$ serves as the error signal output ε. In the example shown in FIG. 6, the error signal output ε may be calculated in the following equation:

$$\varepsilon=\hat{H}(z)=d-\hat{s}=s+H(z)-\hat{s}=H(z)+(s-\hat{s})$$

As described above, the adaptive filter 606 implements at least one adaptive filtering algorithm (such as, but not limited to, at least one LMS algorithm) that adjusts one or more filter coefficients associated with the adaptive filter 606 to reduce the mean square value of the error signal output ε. For example, when the one or more filter coefficients are adjusted, the estimated bias parameter $\hat{s}$ generated by the adaptive filter 606 changes, resulting in changes in the value of $(s-\hat{s})$ in the example equation above. In contrast, the desired signal input H(z) is not affected by changes of the estimated bias parameter s.

In some embodiments, when the error signal output ε has the least mean square value, the value of $(s-\hat{s})$ is the closest to zero. As such, when the error signal output ε has the least mean square value, the estimated bias parameter $\hat{s}$ generated by the adaptive filter 606 is the closest to the actual DC bias component s. As such, the estimated bias parameter $\hat{s}$ indicates an estimated bias component associated with the biased signal input d. For example, the estimated bias parameter $\hat{s}$ indicates an amplitude offset between the mean amplitude of the biased signal input d and zero.

In some embodiments, when the example DC bias reduction system 602 initially estimates the DC bias component of the biased signal input, the adaptive filter 606 may generate an initially estimated bias parameter $\hat{s}_1$ based at least in part on an initial amplitude input x, as represented in the following equation:

$$\hat{s}_1=x$$

In some embodiments, the initial amplitude input x indicates an initially estimated amplitude offset between the mean amplitude of the biased signal input d and zero. In some embodiments, the initial amplitude input x is set by the adaptive filter 606. In some embodiments, the initial amplitude input x is provided to the adaptive filter 606 as an input.

In some embodiments, the initial amplitude input x has a value of 1. In some embodiments, the initial amplitude input x has a value that is less than 1 or more than 1. In some embodiments, because of the self-adjusting characteristics of the adaptive filter 606, no matter the value of the initial amplitude input x the adaptive filter 606 may generate an estimated bias parameter ŝ based on feedback from the error signal output ε that results in the least mean value of the error signal output ε. As described above, when the error signal output ε has the least mean value, the estimated bias parameter ŝ is the closest to the DC bias component s in the biased signal input d.

Referring back to FIG. 6, the adaptive filter 606 provides the estimated bias parameter ŝ to the signal operator 604, and the estimated bias parameter ŝ indicates an estimated bias component associated with the biased signal input d. As illustrated in various examples above, the estimated bias parameter ŝ approximates the DC bias component s in the biased signal input d, as represented in the following equation:

$$\hat{s} \approx s$$

In some embodiments, once the signal operator 604 receives the estimated bias parameter ŝ that approximates the DC bias component s in the biased signal input d, the example DC bias reduction system 602 turns off the adaptive filter 606. As described above, the DC bias component s represents a constant offset in the amplitude of the biased signal input d. In other words, the value of the DC bias component s remains constant over the time frame of the biased signal input d and does not change. As such, there is no need for the adaptive filter 606 to continue estimating the value of the DC bias component s once the error signal output ε converges at the least mean square value. As such, various embodiments of the present disclosure may provide technical benefits and advantages such as, but not limited to, reducing the amount of operational energy needed for removing DC bias component(s) from biased signal inputs.

In some embodiments, the signal operator 604 generates an unbiased signal output based at least in part on the biased signal input d and the estimated bias parameter s. For example, the signal operator 604 may remove the estimated bias component from the biased signal input d based on the estimated bias parameter s, as represented in the following equation:

$$\hat{H}(z)=d-\hat{s}=s+H(z)-\hat{s}=H(z)+(s-\hat{s})\sim H(z)$$

As such, the example DC bias reduction system 602 illustrated in FIG. 6 may estimate the DC bias component of a biased signal input and generate an unbiased signal output. In some embodiments, the unbiased signal output is non-transitory.

Figure 7:
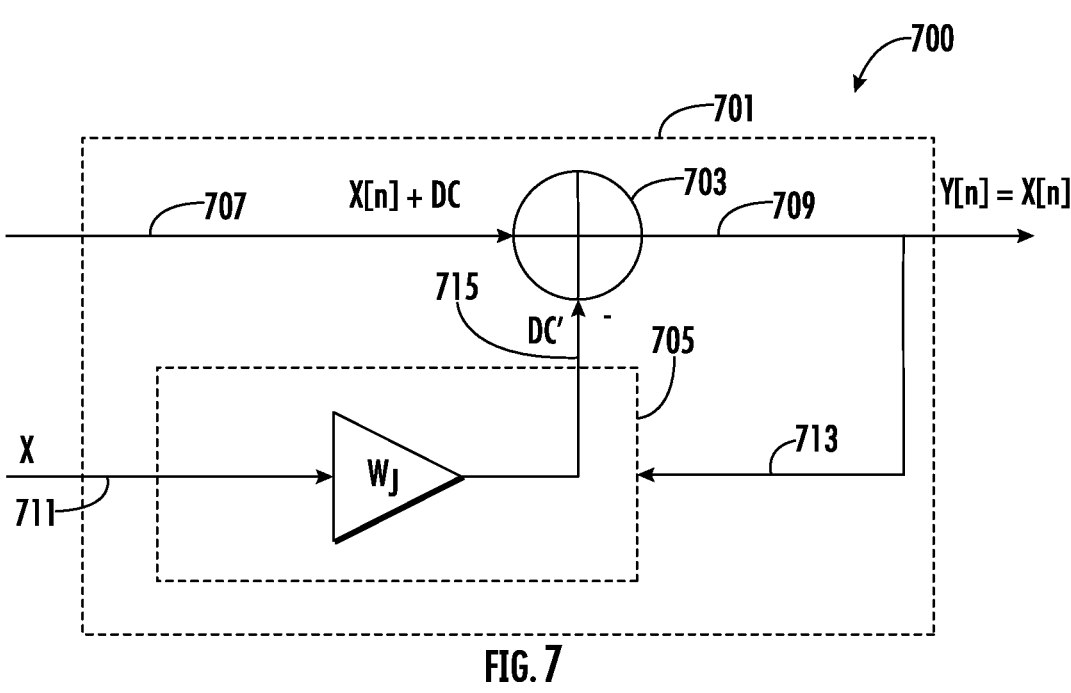
FIG. 7 provides an example signal processing diagram illustrating an example DC bias reduction system in accordance with some embodiments of the present disclosure.

Referring now to FIG. 7, an example signal processing diagram 700 illustrates an example DC bias reduction system 701 in accordance with some embodiments of the present disclosure.

In some embodiments, the example DC bias reduction system 701 is implemented in an example analog front end (AFE) of an ADC to reduce the DC bias component in a biased signal. Additionally, or alternatively, the example DC bias reduction system 701 is implemented in one or more additional or alternative areas of one or more additional or alternative components.

In the example shown in FIG. 7, the example signal processing diagram 700 comprises a signal operator 703 and an adaptive filter 705.

In some embodiments, the signal operator 703 receives the biased signal input (X[n]+DC) via a signal input data path 707. In some embodiments, the signal operator 703 provides the unbiased signal output Y[n] via a signal output data path 709.

In the example shown in FIG. 7, the adaptive filter 705 is not on the signal input data path 707 and is not on the signal output data path 709. For example, the adaptive filter 705 receives the initial amplitude input x from an initial amplitude input data path 711. As described above, the initial amplitude input x is uncorrelated to the X[n] in the biased signal input (X[n]+DC), and is strongly correlated to DC. As such, the adaptive filter 705 is not on the signal input data path 707. In some embodiments, the adaptive filter 705 receives the error signal via an error signal input data path 713. In the example shown in FIG. 7, the error signal input data path 713 is coupled to and separated from the signal output data path 709. As such, the adaptive filter 705 is not on the signal output data path 709. In some embodiments, the adaptive filter 705 provides the estimated bias parameter DC' to the signal operator 703 via the bias parameter input data path 715.

In some embodiments, the adaptive filter 705 being not on the signal input data path 707 and not on the signal output data path 709 may provide various technical benefits and advantages. For example, the adaptive filter 705 decouples the estimation of the DC bias component of the biased signal input from the main data path of the example DC bias reduction system 701 (e.g., the signal input data path 707 and the signal output data path 709). As such, the example DC bias reduction system 701 does not redistribute spectrum energy in the main data path and does not redistribute the power of the DC bias component into other frequency band(s) of interest. In some embodiments, because there is no redistribution of the DC bias component energy, the example DC bias reduction system 701 does not raise the noise floor of the signal output and does not degrade in-band performance as compared to those of many other systems (such as, but not limited to, the example fixed-point DC blocker 101 described above in connection with FIG. 1).

Similar to those described above in connection with FIG. 6, the example DC bias reduction system 701 may remove any unwanted parasitic DC bias component in the signal output.

For example, the signal operator 703 receives a biased signal input that comprises a DC bias component. In other words, the mean amplitude of the biased signal input is not zero. In the example shown in FIG. 7, the biased signal input is represented as (X[n]+DC). In this example, DC represents the DC bias component, and X[n] represents a desired signal input that does not comprise the DC bias component.

In the example shown in FIG. 7, the signal operator 703 also receives an estimated bias parameter DC' from the adaptive filter 705. Similar to those described above in connection with at least FIG. 6, the estimated bias parameter DC' indicates an estimated bias component associated with the biased signal input (X[n]+DC).

As described above, the signal operator 703 may comprise physical hardware and/or software embedded in hardware that may perform one or more operations on one or more inputs. For example, the signal operator 703 may comprise an adder that comprises physical hardware and/or software embedded in hardware that generates a signal output based at least in part on performing addition operations and/or subtraction operations (for example, but not limited to, adding a positive input to a negative input) on two or more inputs.

For example, the signal operator 703 (and/or the adder) may be in the form of one or more software embedded in hardware. In such examples, the signal operator 703 (and/or the adder) comprises one or more processing components that are coupled to one or more peripheral components such as, but not limited to, one or more memory components. In some embodiments, the one or more processing components may comprise one or more of CPLDs, microprocessors, multi-core processors, co-processing entities, ASIPs, ASICs, FPGAs, PLAs, controllers, and/or the like. In some embodiments, the one or more memory components may comprise one or more volatile memories and/or one or more non-volatile memories. Examples of volatile memories may include, but are not limited to, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. Examples of non-volatile memories may include, but are not limited to, ROM, PROM, EPROM, EEPROM, flash memory, SD memory cards, memory sticks, CBRAM, PRAM, FeRAM, RRAM, SONOS, racetrack memory, and/or the like.

In some embodiments, the signal operator 703 (and/or the adder) may comprise programming instructions stored in the one or more memory components. In some embodiments, the programming instructions may comprise one or more signal operation algorithms. In some embodiments, the one or more processing components of the signal operator 703 and/or the adder may execute the programming instructions, such that the one or more processing components of the signal operator 703 (and/or the adder) may perform operations described in the programming instructions (for example, but not limited to, addition operations and/or subtraction operations on two or more inputs).

While the description above provides an example structure of an example signal operator (and/or an example adder), it is noted that the scope of the present disclosure is not limited to the description above. In some examples, an example signal operator (and/or an example adder) in accordance with some embodiments of the present disclosure may comprise one or more additional or alternative electric circuits.

For example, when the signal operation associated with an example signal operator (and/or an example adder) comprises a signal addition operation (e.g. adding two or more input signals together to generate an output signal) and/or a signal substation operation (e.g. subtracting one or more signal inputs from one or more other signal inputs to generate an output signal), an example signal operator (and/or an example adder) may comprise one or more amplifiers (such as, but not limited to, one or more inverting summing amplifiers, one or more non-inverting summing amplifiers, and/or the like), one or more mixer circuits, and/or the like.

Additionally, or alternatively, an example signal operator (and/or an example adder) in accordance with some embodiments of the present disclosure may be in one or more additional and/or alternative forms.

Referring back to FIG. 7, in some embodiments, the signal operator 703 substrates the estimated bias parameter DC' from the biased signal input (X[n]+DC) to generate an unbiased signal output Y[n] as represented in the following equation:

$$Y(n)=X[n]+DC-DC'\approx X[n]$$

In some embodiments, the adaptive filter 705 generates the estimated bias parameter DC' based at least in part on adjusting its filter coefficient $W_j$. In some embodiments, when the filter coefficient $W_j$ results in the least mean square of the error signal output, the adaptive filter 705 generates an estimated bias parameter DC' that indicates an estimated bias component of the biased signal input.

In some embodiments, the adaptive filter 705 may receive an initial amplitude input x as unity, and may generate the first (initial) estimated bias parameter $DC'_1$ based on the initial amplitude input x, as represented in the following equation:

$$DC'_1=x$$

In some embodiments, the initial amplitude input x indicates an initially estimated amplitude offset between the mean amplitude of the biased signal input (X[n]+DC) and zero. In some embodiments, the initial amplitude input x is set by the adaptive filter 705. In some embodiments, the initial amplitude input x is provided to the adaptive filter 705 as an input. A single coefficient is needed because only the magnitude is to be estimated, not any phase component (because of DC).

In some embodiments, the initial amplitude input x has a value of 1. In some embodiments, the initial amplitude input x has a value that is less than 1 or more than 1. In some embodiments, no matter the value of the initial amplitude input x, the adaptive filter 705 may generate a filter coefficient based on feedback from the error signal(s) via the error signal input data path 713 that results in the least mean value of the error signal. As described above, when the error signal has the least mean value, the filter coefficient of the adaptive filter 705 enables the adaptive filter 705 to generate an estimated bias parameter DC' that is the closest to the DC bias component DC in the biased signal input.

Figure 8:
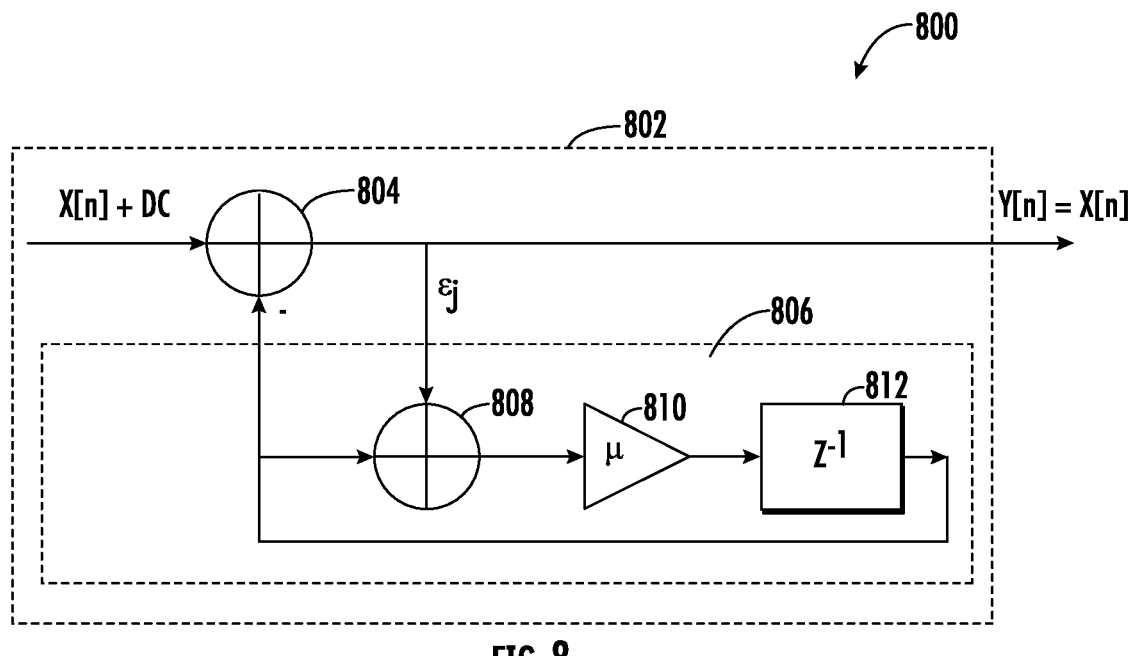
FIG. 8 provides an example signal processing diagram illustrating an example DC bias reduction system in accordance with some embodiments of the present disclosure.

In some embodiments, the adaptive filter 705 implements a LMS algorithm. Referring now to FIG. 8, an example signal processing diagram 800 illustrates an example DC bias reduction system 802 in accordance with some embodiments of the present disclosure. In particular, the example DC bias reduction system 802 shown in FIG. 8 implements an example LMS algorithm.

In some embodiments, the example DC bias reduction system 802 comprises a signal operator 804 and an adaptive filter 806.

Similar to the signal operator 703 described above in connection with FIG. 7, the signal operator 804 may receive a biased signal input (X[n]+DC) and may comprise an adder.

In some embodiments, the adaptive filter 806 comprises a LMS filter. As described above, the DC bias component does not comprise phase information as the frequency of the DC bias component is zero. As such, in some embodiments, the LMS filter may be in the form of a signal tap LMS filter.

In the example shown in FIG. 8, the LMS filter comprises an adder 808, an adaptive adjustment step parameter applier 810, and a delayer 812.

Similar to the various example adders described above, the adder 808 may comprise physical hardware and/or software embedded in hardware that generates a signal output based at least in part on performing addition operations and/or subtraction operations on two or more inputs.

In some embodiments, the adaptive adjustment step parameter applier 810 comprises physical hardware and/or software embedded in hardware that stores the adaptive adjustment step parameter μ of the adaptive filter 806.

For example, the adaptive adjustment step parameter applier 810 comprises one or more memory components that store the adaptive adjustment step parameter u. In some embodiments, the one or more processing components may comprise one or more of CPLDs, microprocessors, multi-core processors, co-processing entities, ASIPs, ASICs, FPGAS, PLAS, controllers, and/or the like. In some embodiments, the one or more memory components may comprise one or more volatile memories and/or one or more non-volatile memories. Examples of volatile memories include, but are not limited to, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. Examples of non-volatile memories may include, but are not limited to, ROM, PROM, EPROM, EEPROM, flash memory, SD memory cards, memory sticks, CBRAM, PRAM, FeRAM, RRAM, SONOS, racetrack memory, and/or the like.

While the description above provides an example structure of the adaptive adjustment step parameter applier, it is noted that the scope of the present disclosure is not limited to the description above. In some examples, an example adaptive adjustment step parameter applier may comprise one or more additional and/or alternative structures.

In some embodiments, the adaptive adjustment step parameter $\mu$ indicates an example unit of adjustment of the filter coefficient $W_j$ that the adaptive filter 806 may implement each time the adaptive filter 806 receives an error signal output $\varepsilon_j$. In some embodiments, the adaptive filter 806 may multiply the error signal output $\varepsilon_j$ with the adaptive adjustment step parameter $\mu$ as the amount of adjustment to the filter coefficient $W_j$.

In some embodiments, the delayer 812 comprises physical hardware and/or software embedded in hardware that may perform one or more sample delay operations (such as, but not limited to, discrete-time operations). For example, in some embodiments, the delayer 812 may comprise one or more memory components that store a previously generated filter coefficient $W_j$. In some embodiments, the one or more processing components may comprise one or more of CPLDs, microprocessors, multi-core processors, co-processing entities, ASIPs, ASICs, FPGAS, PLAs, controllers, and/or the like. In some embodiments, the one or more memory components may comprise one or more volatile memories and/or one or more non-volatile memories. Examples of volatile memories include, but are not limited to, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. Examples of non-volatile memories include, but are not limited to, ROM, PROM, EPROM, EEPROM, flash memory, SD memory cards, memory sticks, CBRAM, PRAM, FeRAM, RRAM, SONOS, racetrack memory, and/or the like.

While the description above provides an example structure of the delayer 812, it is noted that the scope of the present disclosure is not limited to the description above. In some examples, an example delayer may comprise one or more additional and/or alternative structures.

In some embodiments, the delayer 812 indicates that one of the inputs to the adaptive filter 806 is delayed by one sample (for example, delayed by one filter coefficient). For example, the adaptive filter 806 may calculate the filter coefficient $W_{j+1}$ based on the following equation:

$$W_{j+1}=W_j+\mu\varepsilon_j$$

In the equation above, $W_j$ is the previous filter coefficient that is provided to the adaptive filter 806 by the delayer 812. In some embodiments, $W_j$ represents the filter coefficient that was generated by the adaptive filter 806 prior to receiving the error signal output $\varepsilon_j$. As described above, u represents the adaptive adjustment step parameter associated with the adaptive filter 806. As such, the example adaptive filter 806 may generate a self-adjusted filter coefficient $W_{j+1}$ based at least in part on the previous filter coefficient $W_j$, the adaptive adjustment step parameter $\mu$, and the error signal output $\varepsilon_j$.

In some embodiments, the example adaptive filter 806 may receive an initial amplitude input x and generate a first estimated bias parameter $DC'_1$ associated with the biased signal input based at least in part on the initial amplitude input x. In this example, the example adaptive filter 806 may generate a first filter coefficient $W_1$ that equals the initial amplitude input x. In some embodiments, the example adaptive filter 806 may output the first filter coefficient $W_1$ as the first estimated bias parameter $DC'_1$. In such examples, the example adaptive filter 806 may set the first estimated bias parameter $DC'_1$ based on the first filter coefficient $W_1$, as represented in the following equation:

$$DC'_1=W_1=x$$

In some embodiments, the example adaptive filter 806 provides the first estimated bias parameter $DC'_1$ to the signal operator 804, and receives a first error signal output $\varepsilon 1$. In some embodiments, the first signal output from the signal operator 804 serves as the first error signal output $\varepsilon 1$. In such examples, the first error signal output $\varepsilon 1$ may be calculated by removing a first estimated bias component based on the first estimated bias parameter $DC'_1$ from the biased signal input, as shown in the following equation:

$$\varepsilon_1=(X[n]+DC)-DC'_1$$

In some embodiments, upon receiving the first error signal output $\varepsilon_1$, the example adaptive filter 806 generates a second estimated bias parameter $DC'_2$. Similar to those described above, the example adaptive filter 806 may adjust the first filter coefficient $W_1$ to generate a second filter coefficient $W_2$, and output the second filter coefficient $W_2$ as the second estimated bias parameter $DC'_2$. In such examples, the second estimated bias parameter $DC'_2$ equals the second filter coefficient $W_2$.

In some embodiments, the example adaptive filter 806 generates the second estimated bias parameter $DC'_2$ based at least in part on adding the first estimated bias parameter $DC'_1$ and a first multiplication of the first error signal output $\varepsilon_1$ and an adaptive adjustment parameter $\mu$, as represented in the following equations:

$$DC'_2=DC'_1+\mu\varepsilon_1.$$

In some embodiments, the example adaptive filter 806 outputs filter coefficients as the estimated bias parameters. In such examples, the above equation may be represented as the following filter coefficient adjustment equation:

$$W_2=W_1+\mu\varepsilon_1$$

In some embodiments, the example adaptive filter 806 provides the second estimated bias parameter $DC'_2$ to the signal operator 804, and receives a second error signal output 82. In some embodiments, the example adaptive filter 806 generates a third estimated bias parameter $DC'3$ based at least in part on adding the second estimated bias parameter $DC'_2$ and a second multiplication of the second error signal output 82 and an adaptive adjustment parameter $\mu$.

In some embodiments, the above process is repeated until the filter coefficient $W_j$ results in the least mean square of the error signal output $\varepsilon_j$. In some embodiments, when the filter coefficient $W_j$ results in the least mean square of the error signal output $\varepsilon_j$, the example adaptive filter 806 sets the filter coefficient $W_j$ as the estimated bias parameter DC' that indicates an estimated bias component from the biased input signal.

In some embodiments, the signal operator 804 generates an unbiased signal output based at least in part on the biased signal input and the estimated bias parameter DC'. For example, the signal operator 804 removes the estimated bias component DC from the biased signal input based on the estimated bias parameter DC' as represented in the following equation:

$$Y(n)=X[n]+DC-DC'\approx X(n)$$

As such, the example DC bias reduction system 802 illustrated in FIG. 8 may estimate the DC bias component of a biased signal input and may generate an unbiased signal output. In some embodiments, the unbiased signal output is non-transitory.

Figure 9:
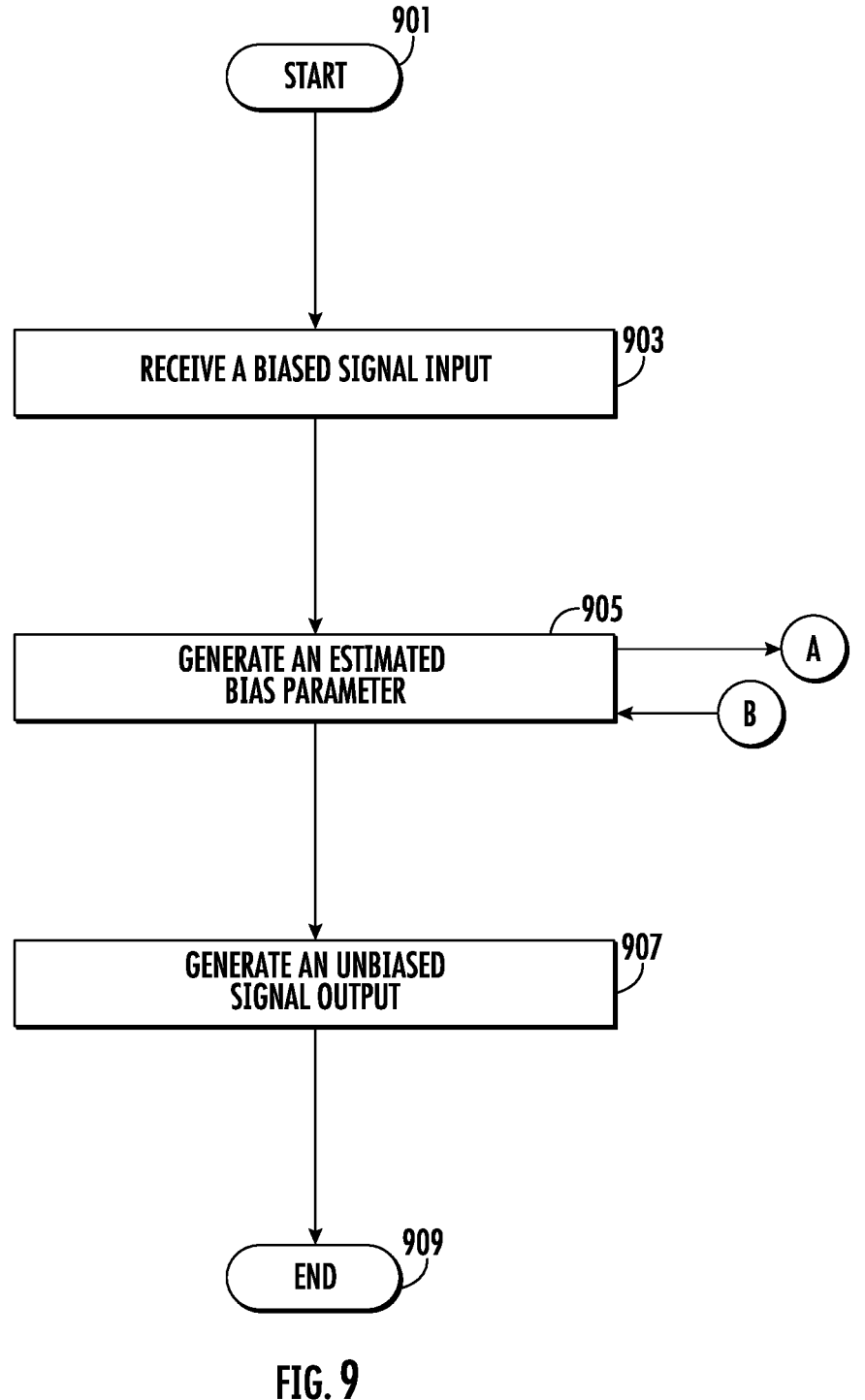
FIG. 9 provides an example flow diagram illustrating an example method in accordance with some embodiments of the present disclosure.
Figure 10:
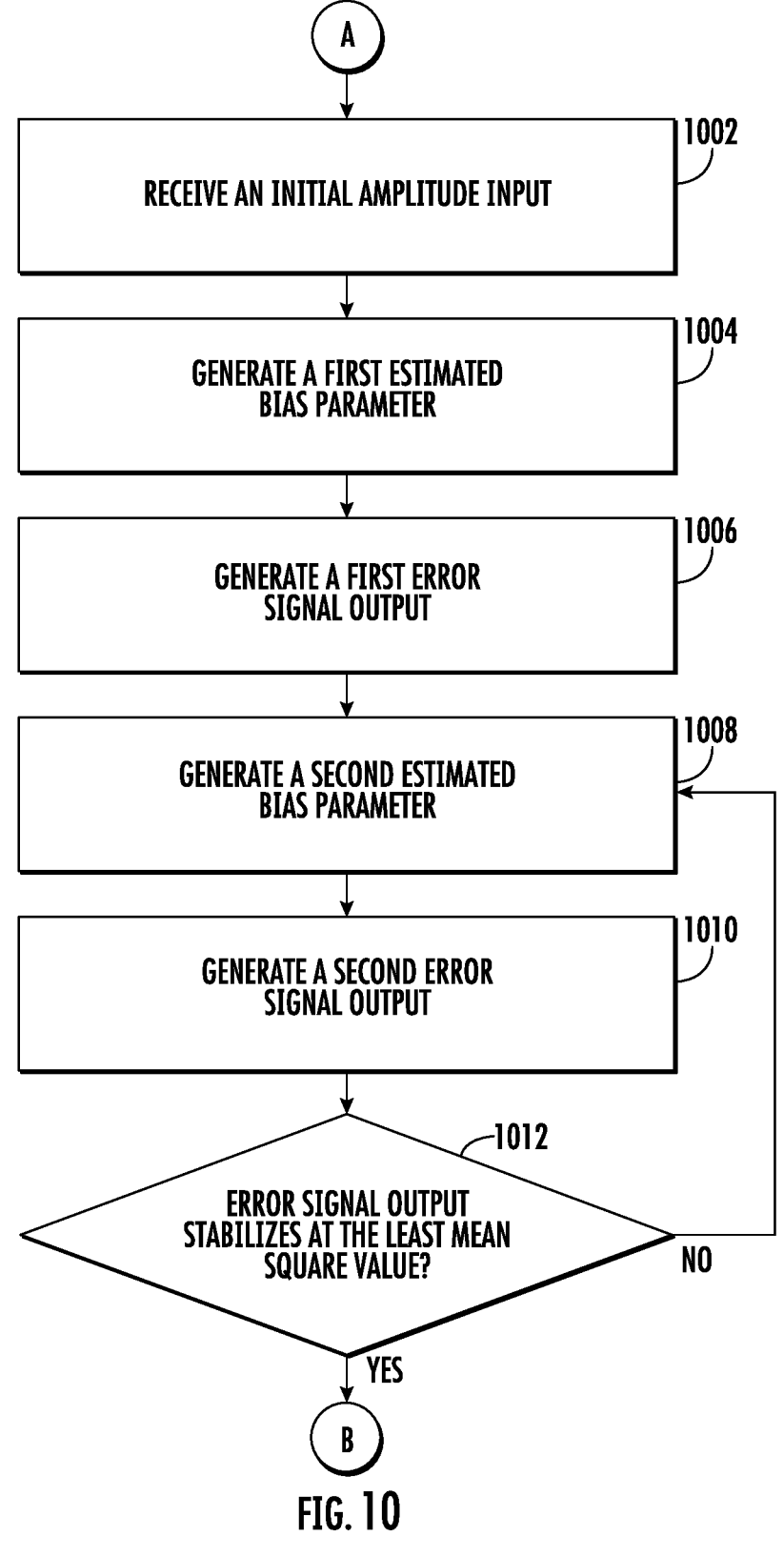
FIG. 10 provides an example flow diagram illustrating an example method in accordance with some embodiments of the present disclosure.

Referring now to FIG. 9 and FIG. 10, example flow diagrams illustrating example methods in accordance with some embodiments of the present disclosure are provided.

It is noted that each block of the flowchart, and combinations of blocks in the flowchart, may be implemented by various means such as hardware, firmware, circuitry and/or other devices associated with execution of software including one or more programming instructions. For example, one or more of the methods described in FIG. 9 to FIG. 10 may be embodied by programming instructions, which may be stored by a non-transitory memory component of an apparatus employing an embodiment of the present disclosure and executed by one or more processing components in the apparatus. These programming instructions may direct the processing components or other programmable apparatus to function in a particular manner, such that the instructions stored in the non-transitory memory component produce an article of manufacture, the execution of which implements the function specified in the flowchart block(s).

As described above and as will be appreciated based on this disclosure, embodiments of the present disclosure may be configured as methods, devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Similarly, embodiments may take the form of a computer program code stored on at least one non-transitory computer-readable storage medium. Any suitable computer-readable storage medium may be utilized including non-transitory hard disks, CD-ROMs, flash memory, optical storage devices, or magnetic storage devices.

Referring now to FIG. 9, an example method 900 in accordance with some embodiments of the present disclosure is illustrated. In particular, the example method 900 illustrates example steps/operations of generating an example unbiased signal output in accordance with some embodiments of the present disclosure.

In the example shown in FIG. 9, the example method 900 starts at block 901 and proceeds to step/operation 903. In some embodiments, at step/operation 903, an example DC bias reduction system (such as, but not limited to, the example DC bias reduction systems described above in connection with FIG. 6 to FIG. 8) may receive a biased signal input.

As described above, the biased signal input refers to a signal (such as, but not limited to, an analog signal, a digital signal, and/or the like) that comprises a DC bias component. In some embodiments, the mean amplitude of the biased signal input is not zero. In some embodiments, the DC bias component indicates the value of the mean amplitude of the biased signal input.

Referring back to FIG. 9, subsequent to step/operation 903, the example method 900 proceeds to step/operation 905. In some embodiments, at step/operation 905, an example DC bias reduction system (such as, but not limited to, the example DC bias reduction systems described above in connection with FIG. 6 to FIG. 8) may generate an estimated bias parameter.

In some embodiments, the estimated bias parameter indicates an estimated DC bias component associated with the biased signal input received at step/operation 903. For example, the estimated bias parameter may indicate an amplitude offset between the mean amplitude of the biased signal input and zero.

In some embodiments, the example DC bias reduction system may generate the estimated bias parameter by implementing an adaptive filter. Similar to those described above, the adaptive filter may execute an adaptive filtering algorithm that dynamically generates and refines the estimated bias parameter. Additional details associated with generating the estimated bias parameter are described herein, including, but not limited to, those described in connection with at least FIG. 10.

Referring back to FIG. 9, subsequent to step/operation 905, the example method 900 proceeds to step/operation 907. In some embodiments, at step/operation 907, an example DC bias reduction system (such as, but not limited to, the example DC bias reduction systems described above in connection with FIG. 6 to FIG. 8) may generate an unbiased signal output.

In some embodiments, the example DC bias reduction system generates the unbiased signal output based at least in part on the biased signal input received at step/operation 903 and the estimated bias parameter generated at step/operation 905.

In some embodiments, the biased signal input received at step/operation 903 comprises a DC bias component that causes the mean amplitude of the biased signal input to be not zero. In some embodiments, the estimated bias parameter generated at step/operation 905 indicates an estimated amplitude offset between the mean amplitude of the biased signal input and zero. In some embodiments, the example DC bias reduction system generates the unbiased signal output at step/operation 905 by removing the estimated amplitude offset indicated by the estimated bias parameter from the biased signal input. For example, if the estimated bias parameter generated at step/operation 905 indicates an estimated amplitude offset of +14 dB, the example DC bias reduction system reduces the biased signal input by 14 dB to generate an unbiased signal output.

Referring back to FIG. 9, subsequent to step/operation 907, the example method 900 proceeds to block 909 and ends.

Referring now to FIG. 10, an example method 1000 in accordance with some embodiments of the present disclosure is illustrated. In particular, the example method 1000 illustrates example steps/operations of generating an example estimated bias parameter in accordance with some embodiments of the present disclosure.

In the example shown in FIG. 10, the example method 1000 starts at block A, which is connected to step/operation 905 shown in FIG. 9. In some embodiments, subsequent to and/or in response to block A (e.g. as a part of step/operation 905 shown in FIG. 9), the example method 1000 proceeds to step/operation 1002. At step/operation 1002, an example DC bias reduction system (such as, but not limited to, the example DC bias reduction systems described above in connection with FIG. 6 to FIG. 8) may receive an initial amplitude input.

In some embodiments, the initial amplitude input indicates an initial amplitude as an input for the adaptive filter. The initial amplitude input is correlated to the biased signal input, but uncorrelated to the non-DC component signal input.

For example, as described above, the initial amplitude input indicates an initially estimated amplitude offset between the mean amplitude of the biased signal input and zero. In some embodiments, the initial amplitude input is set by the example DC bias reduction system. Additionally, or alternatively, the initial amplitude input is provided to the example DC bias reduction system as a part of an input.

Referring back to FIG. 10, subsequent to step/operation 1002, the example method 1000 proceeds to step/operation 1004. In some embodiments, at step/operation 1004, an example DC bias reduction system (such as, but not limited to, the example DC bias reduction systems described above in connection with FIG. 6 to FIG. 8) may generate a first estimated bias parameter.

In some embodiments, the example DC bias reduction system generates the first estimated bias parameter associated with the biased signal input based at least in part on the initial amplitude input received at step/operation 1002. In some embodiments, the first estimated bias parameter equals the initial amplitude input received at step/operation 1002.

Referring back to FIG. 10, subsequent to step/operation 1004, the example method 1000 proceeds to step/operation 1006. In some embodiments, at step/operation 1006, an example DC bias reduction system (such as, but not limited to, the example DC bias reduction systems described above in connection with FIG. 6 to FIG. 8) may generate a first error signal output.

In some embodiments, the example DC bias reduction system generates the first error signal output based at least in part on the first estimated bias parameter generated at step/operation 1004 and the biased signal input.

For example, the first estimated bias parameter may indicate a first estimated bias component. In such an example, the first estimated bias component indicates an estimated offset between the amplitude of the biased signal input and zero.

In some embodiments, the example DC bias reduction system may remove the first estimated bias component from the biased signal input to generate the first error signal output, similar to the examples described above.

Referring back to FIG. 10, subsequent to step/operation 1006, the example method 1000 proceeds to step/operation 1008. In some embodiments, at step/operation 1008, an example DC bias reduction system (such as, but not limited to, the example DC bias reduction systems described above in connection with FIG. 6 to FIG. 8) may generate a second estimated bias parameter.

In some embodiments, the example DC bias reduction system generates the second estimated bias parameter based at least in part on the first error signal output generated at step/operation 1006 and the first estimated bias parameter generated at step/operation 1004.

For example, in some embodiments, the example DC bias reduction system generates the second estimated bias parameter $W_2$ based at least on adding the first estimated bias parameter $W_1$ to a first multiplication of the first error signal output $\varepsilon_1$ and an adaptive adjustment parameter $\mu$, as reflected in the following equation:

$$W_2 = W_1 + \mu \varepsilon_1$$

Referring back to FIG. 10, subsequent to step/operation 1008, the example method 1000 proceeds to step/operation 1010. In some embodiments, at step/operation 1010, an example DC bias reduction system (such as, but not limited to, the example DC bias reduction systems described above in connection with FIG. 6 to FIG. 8) may generate a second error signal output.

In some embodiments, the example DC bias reduction system generates the second error signal output based at least in part on the second estimated bias parameter generated at step/operation 1008 and the biased signal input.

For example, the second estimated bias parameter may indicate a second estimated bias component. In such an example, the second estimated bias component indicates an estimated offset between the amplitude of the biased signal input and zero.

In some embodiments, the example DC bias reduction system may remove the second estimated bias component from the biased signal input to generate the second error signal output, similar to the examples described above.

Referring back to FIG. 10, subsequent to step/operation 1010, the example method 1000 proceeds to step/operation 1012. In some embodiments, at step/operation 1012, an example DC bias reduction system (such as, but not limited to, the example DC bias reduction systems described above in connection with FIG. 6 to FIG. 8) may determine whether the error signal output stabilizes at the least mean square value.

If, at step/operation 1012, the example DC bias reduction system determines that the error signal output does not stabilize at the least mean square value, the example method 1000 returns to step/operation 1008. In some embodiments, the example DC bias reduction system generates a third estimated bias parameter based at least in part on the second error signal output and the second estimated bias parameter.

For example, in some embodiments, the example DC bias reduction system generates the third estimated bias parameter $W_3$ based at least on adding the second estimated bias parameter $W_2$ to a second multiplication of the second error signal output $\varepsilon_2$ and an adaptive adjustment parameter $\mu$, as reflected in the following equation:

$$W_3 = W_2 + \mu \varepsilon_2$$

In some embodiments, the example DC bias reduction system generates a third error signal output based at least in part on the third estimated bias parameter and the biased signal input, similar to those described above.

Referring back to FIG. 10, if, at step/operation 1012, the example DC bias reduction system determines that the error signal output stabilizes at the least mean square value, the example method 1000 proceeds to block B. Referring back to FIG. 9, block B connects back to step/operation 905.

As illustrated above, FIG. 10 illustrates an example method 1000 of generating an estimated bias parameter that indicates an estimated DC bias component of the biased signal input. For example, the example method 1000 implements a gradient descent method algorithm that adjusts the estimated bias parameter so that the error signal output converges towards the least mean square value.

As an example, at step/operation 1008, the example DC bias reduction system may generate a $(n+1)^{th}$ estimated bias parameter $W_{n+1}$ based at least on adding the $(n)^{th}$ estimated bias parameter $W_n$ to a multiplication of the $(n)^{th}$ error signal output $\varepsilon_n$ and an adaptive adjustment parameter $\mu$, as reflected in the following equation:

$$W_{n+1}=W_n+\mu\varepsilon_n$$

Continuing this example, at step/operation 1010, the example DC bias reduction system may generate a $(n+1)^{th}$ error output signal $\varepsilon_{n+1}$ based at least in part on the $(n+1)^{th}$ estimated biased parameter $W_{n+1}$ and the biased signal input X, as reflected in the following equation:

$$\varepsilon_{n+1}=X-W_{n+1}$$

In some embodiments, the example DC bias reduction system may compare the mean square value of the $(n+1)^{th}$ error output signal $\varepsilon_{n+1}$ with the mean square value of the $(n)^{th}$ error output signal $\varepsilon_n$ to determine whether the error signal output has stabilized at the least mean square value at step/operation 1012.

In some embodiments, the example DC bias reduction system may determine that the mean square value of the $(n+1)^{th}$ error output signal $\varepsilon_{n+1}$ is less than the mean square value of the $(n)^{th}$ error output signal $\varepsilon_n$, as reflected below:

$$|\varepsilon_{n+1}|^2<|\varepsilon_n|^2$$

In the above example, the example DC bias reduction system determines that the error signal output has not stabilized at the least mean square value. In such an example, the example DC bias reduction system may generate a $(n+2)^{th}$ estimated bias parameter $W_{n+2}$ and a $(n+2)^{th}$ error output signal $\varepsilon_{n+2}$, and may compare the mean square value of the $(n+1)^{th}$ error output signal $\varepsilon_{n+1}$ and the mean square value of the $(n+2)^{th}$ error output signal $\varepsilon_{n+2}$ to determine whether the error signal output has stabilized at the least mean square value.

In some embodiments, the example DC bias reduction system may determine that the mean square value of the $(n+1)^{th}$ error output signal $\varepsilon_{n+1}$ is more than the mean square value of the $(n)^{th}$ error output signal $\varepsilon_n$, as reflected below:

$$|\varepsilon_{n+1}|^2>|\varepsilon_n|^2$$

In the above example, the example DC bias reduction system determines that the error signal output has not stabilized at the least mean square value. In such an example, the example DC bias reduction system may generate a $(n+2)^{th}$ estimated bias parameter $W_{n+2}$ and a $(n+2)^{th}$ error output signal $\varepsilon_{n+2}$, and may compare the mean square value of the $(n+1)^{th}$ error output signal $\varepsilon_{n+1}$ and the mean square value of the $(n+2)^{th}$ error output signal $\varepsilon_{n+2}$ to determine whether the error signal output has stabilized at the least mean square value.

In some embodiments, the example DC bias reduction system may determine that the mean square value of the $(n+1)^{th}$ error output signal $\varepsilon_{n+1}$ equals the mean square value of the $(n)^{th}$ error output signal $\varepsilon_n$, as reflected below:

$$|\varepsilon_{n+1}|^2=|\varepsilon_n|^2$$

In the above example, the example DC bias reduction system determines that the error signal output has stabilized at the least mean square value. In such an example, the example DC bias reduction system provides the $(n+1)^{th}$ estimated bias parameter $W_{n+1}$ (or the $(n)^{th}$ estimated bias parameter $W_n$) as the estimated bias parameter.

Figure 11:
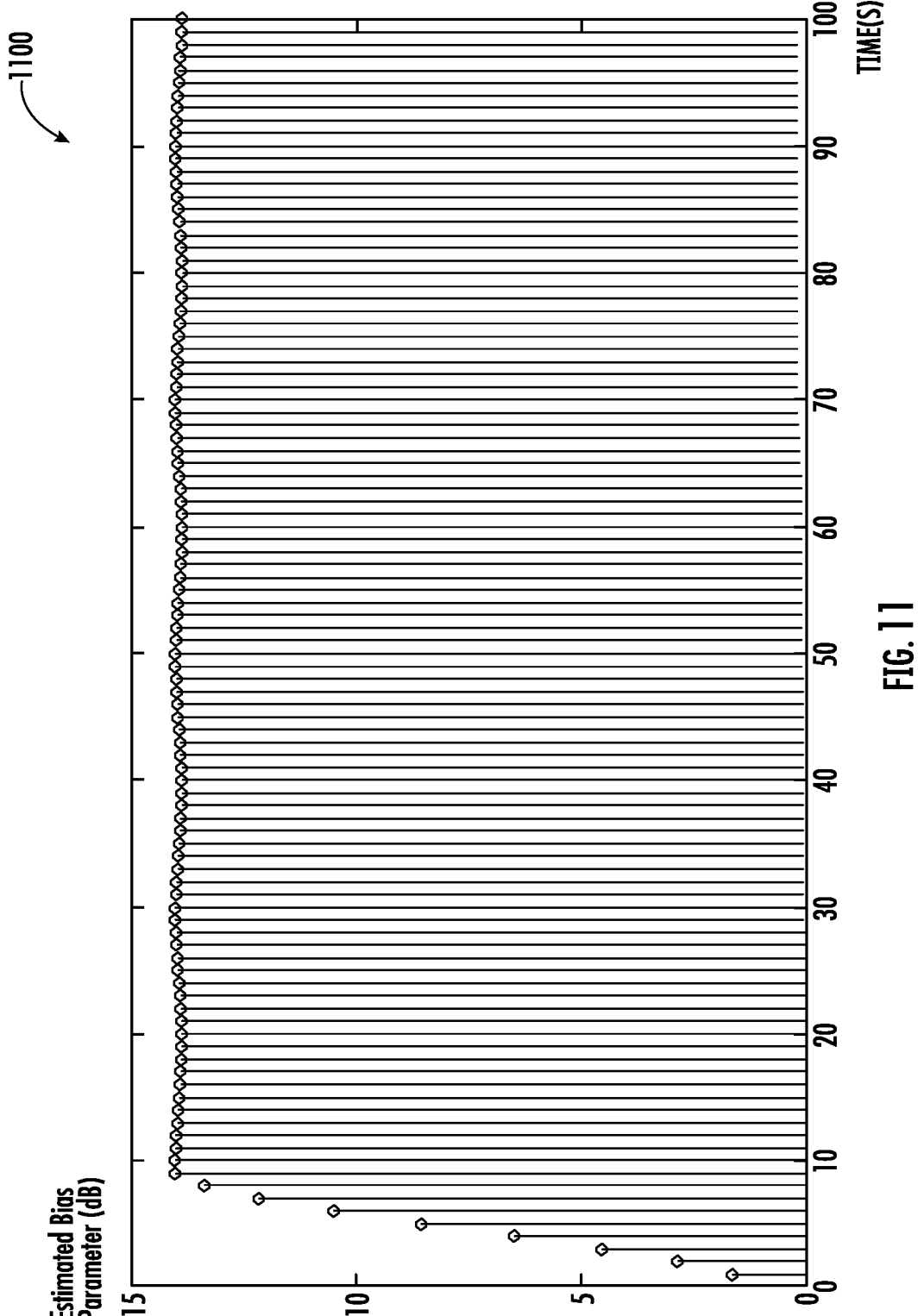
FIG. 11 provides an example diagram illustrating example estimated bias parameters generated over a series of time points in accordance with some embodiments of the present disclosure.

Referring now to FIG. 11, an example diagram 1100 is provided. In particular, the example diagram 1100 illustrates example estimated bias parameters that are generated by an example DC bias reduction system in accordance with some embodiments of the present disclosure.

In the example diagram 1100, each estimated bias parameter is generated based at least in part on the previous estimated bias parameter, the previous error signal output, and the adaptive adjustment parameter. In some embodiments, each estimated bias parameter is generated based at least in part on adding the previous estimated bias parameter to a multiplication of the previous error signal output and an adaptive adjustment parameter.

As illustrated in the example diagram 1100, the example estimated bias parameter stabilizes around 14 dB. In such an example, when the example estimated bias parameter is at 14 dB, the error signal output has stabilized at the least mean square value. In this example, the example DC bias reduction system generates an estimated bias parameter indicating an estimated bias component of 14 dB. Continuing in this example, the example DC bias reduction system removes an amplitude in the amount of 14 dB from the biased signal input to generate an unbiased signal output.

Figure 12:
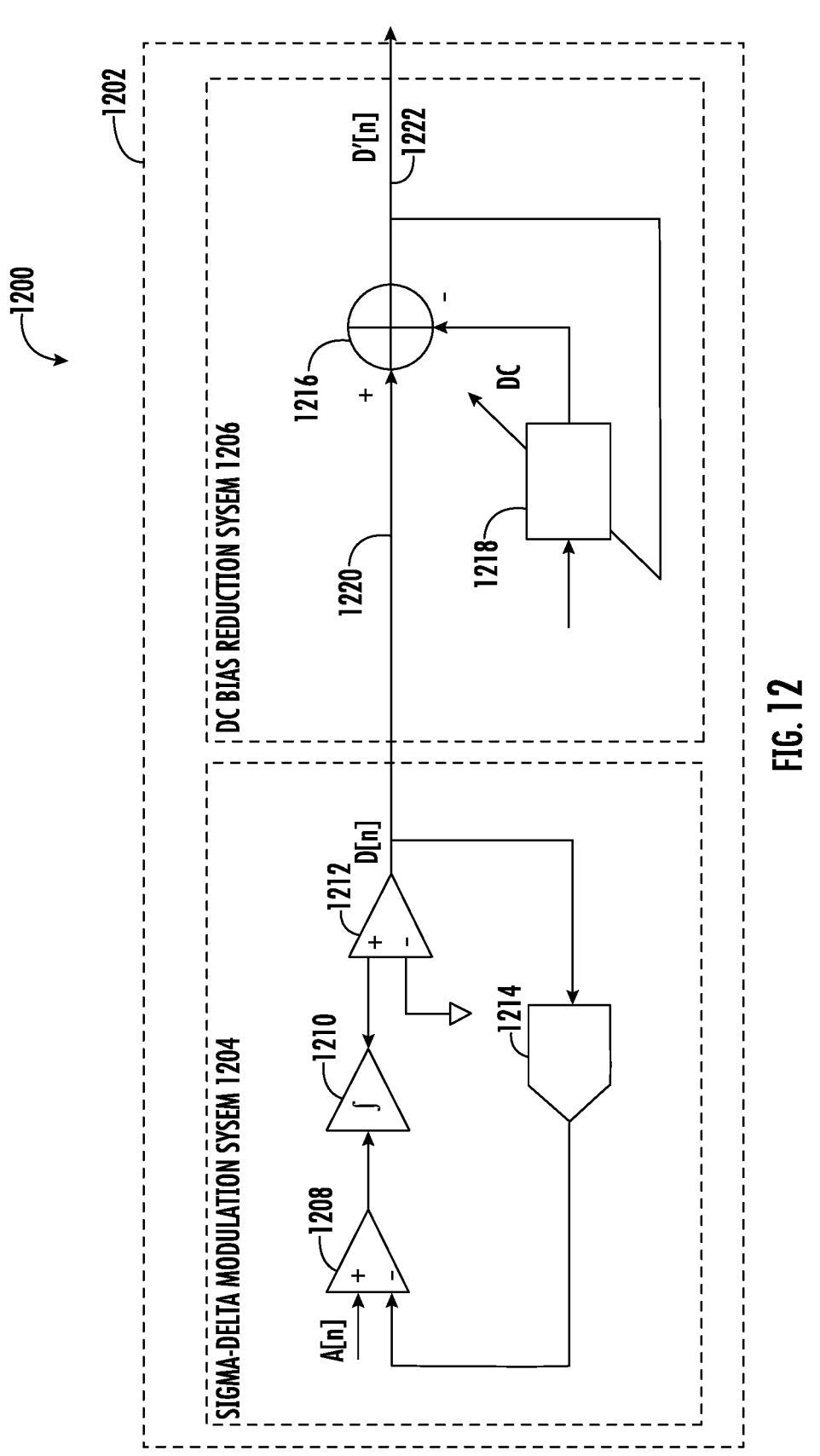
FIG. 12 provides an example diagram illustrating an example analog-to-digital converter (ADC) in accordance with some embodiments of the present disclosure.

Referring now to FIG. 12, an example diagram 1200 illustrating an example ADC 1202 in accordance with some embodiments of the present disclosure is provided.

In the example shown in the example diagram 1200, the example ADC 1202 comprises a sigma-delta modulation system 1204 and a DC bias reduction system 1206.

In some embodiments, the sigma-delta modulation system 1204 receives an analog input signal A[n] and generates a digital output signal D[n]. For example, in some embodiments, the sigma-delta modulation system 1204 comprises a difference amplifier 1208, an integrator 1210, and a comparator 1212 with feedback loop that contains a one-bit digital-to-analog converter (DAC) 1214. In some embodiments, the DAC 1214 is a switch that connects the negative input of the difference amplifier 1208 to a positive or a negative reference voltage. In some embodiments, the DAC 1214 maintains the average output of the integrator 1210 near the reference level of the comparator 1212.

While the example diagram 1200 illustrates an example structure of an example sigma-delta modulation system, it is noted that the scope of the present disclosure is not limited to the example shown in example diagram 1200. In some embodiments, an example sigma-delta modulation system may comprise one or more additional or alternative components.

In some embodiments, the digital signal output D[n] generated by the sigma-delta modulation system 1204 is a biased signal. In such examples, the digital signal output D[n] comprises a DC bias component. In some embodiments, the sigma-delta modulation system 1204 provides the digital signal output D[n] as the biased signal to the DC bias reduction system 1206.

In the example shown in FIG. 12, the DC bias reduction system 1206 comprises a signal operator 1216 and an adaptive filter 1218.

In some embodiments, the signal operator 1216 receives the digital signal output D[n] as a biased signal. In some embodiments, the adaptive filter 1218 generates an estimated bias parameter DC, similar to the various examples described above. In some embodiments, the estimated bias parameter DC indicates an estimated DC bias component in the digital signal output D[n], similar to various examples described above. In some embodiments, the adaptive filter 1218 implements a LMS algorithm to generate the estimated biased parameter DC, similar to the various examples described above.

In some embodiments, the signal operator 1216 generates an unbiased signal output D'[n] based at least in part on the biased signal D[n] received from the sigma-delta modulation system 1204 and the estimated bias parameter DC from the adaptive filter 1218.

For example, the signal operator 1216 may comprise an adder. In such an example, when generating the unbiased signal output D'[n], the signal operator 1216 removes the estimated bias component from the biased signal input D[n] based at least in part on the estimated bias parameter DC generated by the adaptive filter 1218, similar to the various examples described above.

In some embodiments, the signal operator 1216 receives the biased signal D[n] via a signal input data path 1220 and provides the unbiased signal output D'[n] via a signal output data path 1222. In some embodiments, the adaptive filter 1218 is not on the signal input data path 1220 and is not on the signal output data path 1222, similar to the various examples described above.

While the example diagram 1200 illustrates an example structure of the DC bias reduction system 1206, it is noted that the scope of the present disclosure is not limited to the example shown in example diagram 1200. In some embodiments, an example DC bias reduction system 1206 may comprise one or more additional or alternative components.

Figures 13, 14:
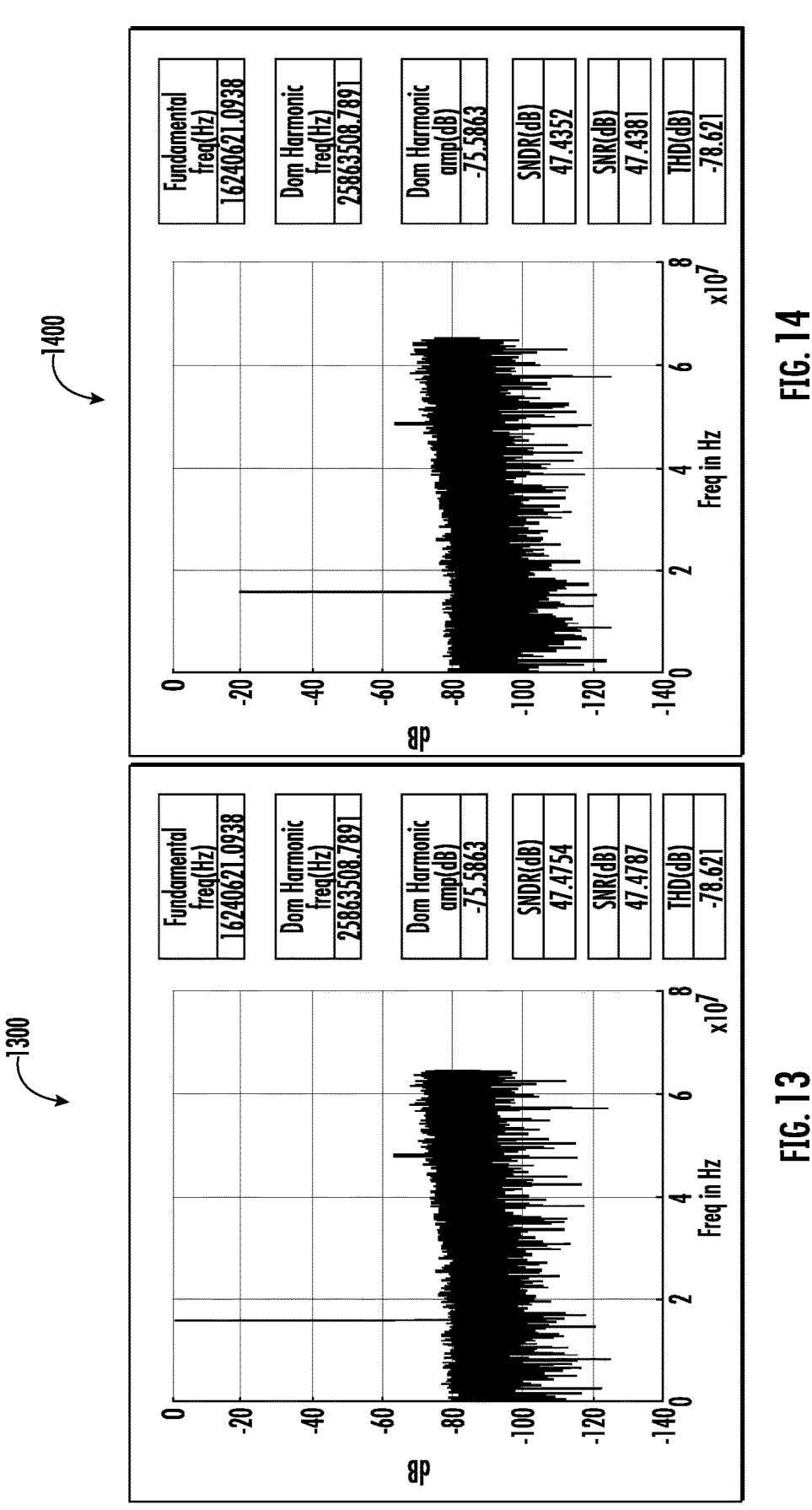
FIG. 13 provides an example response diagram illustrating example magnitudes and example frequencies (along with example signal measurement parameters) associated with an example biased signal input that is not processed by an example DC bias reduction system in accordance with some embodiments of the present disclosure.
FIG. 14 provides an example response diagram illustrating example magnitudes and example frequencies (along with example signal measurement parameters) associated with an example unbiased signal output that generated by an example DC bias reduction system based at least in part on processing the example biased signal input shown in FIG. 13 in accordance with some embodiments of the present disclosure.

As described above, example methods, systems, and apparatus for reducing DC bias in accordance with some embodiments of the present disclosure provide various technical benefits and advantages. Referring now to FIG. 13 and FIG. 14, example diagrams illustrating various example technical benefits and advantages in accordance with some embodiments of the present disclosure are provided.

In particular, FIG. 13 provides an example response diagram 1300 illustrating example magnitudes and example frequencies (along with example signal measurement parameters) associated with an example biased signal input that is not processed by example apparatuses, methods, or systems in accordance with some embodiments of the present disclosure (including, but not limited to, an example DC bias reduction system in accordance with some embodiments of the present disclosure). In contrast, FIG. 14 provides an example response diagram 1400 illustrating example magnitudes and example frequencies (along with example signal measurement parameters) associated with an example unbiased signal output that generated by example apparatuses, methods, or systems in accordance with some embodiments of the present disclosure (including, but not limited to, an example DC bias reduction system in accordance with some embodiments of the present disclosure) based on the example biased signal input shown in FIG. 13.

As described above, many DC filters lie in the data path, causing technical challenges and difficulties such as, but not limited to, increasing group delay at lower frequencies, increasing noise level of the non-DC frequencies, and worsening SNR degradation. In contrast, various example embodiments of the present disclosure provide various technical benefits and advantages in removing DC bias components from a biased signal input. For example, the example comparison between the example response diagram 1400 with the example response diagram 1300 highlights that there is little to no loss in the signal SNR (for example, a SNR of 47.4787 dB shown in the example response diagram 1300 compared to a SNR of 47.4381 dB shown in the example response diagram 1400) because an example adaptive filter in accordance with some embodiments of the present disclosure does not redistribute energy into other frequency bands. In some embodiments, an example DC bias reduction system may operate in background and decorrelate DC from the output without sitting in the data path. In some embodiments, an example DC bias reduction system does not cause group delay issues because there is no data path contribution. In some embodiments, an example DC bias reduction system provides better results as compared to the results from a moving average filter in terms of area and power. In some embodiments, an example DC bias reduction system may shut down the adaptive filter once the estimated bias parameter is determined so as to save dynamic power.

While this detailed description has set forth some embodiments of the present invention, the appended claims also cover other embodiments of the present invention which may differ from the described embodiments according to various modifications and improvements. For example, in some embodiments, an example adaptive filter may additionally or alternatively implement a recursive least square (RLS) algorithm. In some embodiments, an example adaptive filter may additionally or alternatively implement a normalized LMS algorithm. In some embodiments, an example adaptive filter may implement one or more additional or alternative adaptive filtering algorithms.

Within the appended claims, unless the specific term "means for" or "step for" is used within a given claim, it is not intended that the claim be interpreted under 35 U.S.C. 112, paragraph 6.

The invention claimed is:

1. A system comprising:
a signal operator receiving a biased signal input; and
an adaptive filter providing an estimated bias parameter to the signal operator, the estimated bias parameter indicating an estimated bias component associated with the biased signal input,
wherein the signal operator generates an unbiased signal output based at least in part on the biased signal input and the estimated bias parameter.

2. The system of claim 1, wherein the signal operator comprises an adder.

3. The system of claim 1, wherein, when generating the unbiased signal output, the signal operator removes the estimated bias component from the biased signal input.

4. The system of claim 3, wherein the signal operator receives the biased signal input via a signal input data path and provides the unbiased signal output via a signal output data path, wherein the adaptive filter is not on the signal input data path and is not on the signal output data path.

5. The system of claim 1, wherein the adaptive filter implements a Least Mean Square (LMS) algorithm.

6. The system of claim 5, wherein the adaptive filter comprises an adder and a delayer.

7. The system of claim 5, wherein the adaptive filter receives an initial amplitude input.

8. The system of claim 7, wherein the initial amplitude input is correlated to the biased signal input.

9. A method comprising:
receiving a biased signal input;
generating an estimated bias parameter indicating an estimated DC bias associated with the biased signal input; and
generating an unbiased signal output based at least in part on the biased signal input and the estimated bias parameter.

10. The method of claim 9, further comprising:
receiving an initial amplitude input.

11. The method of claim 10, wherein the initial amplitude input is correlated to the biased signal input.

12. The method of claim 10, further comprising:
generating a first estimated bias parameter associated with the biased signal input based at least in part on the initial amplitude input; and
generating a first error signal output based at least in part on the first estimated bias parameter and the biased signal input.

13. The method of claim 12, further comprising:
generating a second estimated bias parameter based at least in part on adding the first estimated bias parameter to a first multiplication of the first error signal output and an adaptive adjustment parameter; and
generating a second error signal output based at least in part on the second estimated bias parameter and the biased signal input.

14. An analog-to-digital converter (ADC) comprising:
a sigma-delta modulation system generating a biased signal; and

a DC bias reduction system comprising a signal operator and an adaptive filter, wherein the signal operator receives the biased signal, wherein the adaptive filter provides an estimated bias parameter to the signal operator, wherein the signal operator generates an unbiased signal based at least in part on the biased signal and the estimated bias parameter.

15. The ADC of claim 14, wherein the signal operator comprises an adder.

16. The ADC of claim 14, wherein, when generating the unbiased signal, the signal operator removes an estimated bias component from the biased signal based on the estimated bias parameter.

17. The ADC of claim 16, wherein the signal operator receives the biased signal via a signal input data path and provides the unbiased signal via a signal output data path, wherein the adaptive filter is not on the signal input data path and is not on the signal output data path.

18. The ADC of claim 17, wherein the adaptive filter implements a Least Mean Square (LMS) algorithm.

* * * * *